(12) United States Patent
Kim

(10) Patent No.: US 6,982,447 B2
(45) Date of Patent: Jan. 3, 2006

(54) FERROELECTRIC MEMORY DEVICES

(75) Inventor: Hyun-ho Kim, Gyeonggi-do (KR)

(73) Assignee: Samsung Electronics Co., Ltd., (KR)

(*) Notice: Subject to any disclaimer, the term of this patent is extended or adjusted under 35 U.S.C. 154(b) by 0 days.

(21) Appl. No.: 10/788,105

(22) Filed: Feb. 26, 2004

(65) Prior Publication Data

US 2004/0173829 A1   Sep. 9, 2004

(30) Foreign Application Priority Data

Mar. 5, 2003   (KR) .................. 10-2003-0013748

(51) Int. Cl.
*H01L 27/108* (2006.01)
*H01L 29/76* (2006.01)
*H01L 29/94* (2006.01)
*H01L 31/119* (2006.01)

(52) U.S. Cl. ............... 257/295; 257/306; 257/310
(58) Field of Classification Search ........ 257/295–310; 438/253–254, 396–398
See application file for complete search history.

(56) References Cited

U.S. PATENT DOCUMENTS

2002/0196653 A1 * 12/2002 Kim et al. ............... 257/310

FOREIGN PATENT DOCUMENTS

| JP | 11-145414 | 7/2002 |
| KR | 2002-59517 | 5/1999 |

* cited by examiner

*Primary Examiner*—Cuong Nguyen

(74) *Attorney, Agent, or Firm*—Myers Bigel Sibley & Sajovec, P.A.

(57) ABSTRACT

A ferroelectric memory device includes a semiconductor substrate, ferroelectric capacitors, conductive patterns, and plate lines. The ferroelectric capacitors are arranged in rows and columns on the semiconductor substrate. The conductive patterns are arranged in even numbered and odd numbered rows. Each of the conductive patterns is on, and electrically connected to, a plurality of adjacent ones of the ferroelectric capacitors. The plate lines are in rows that extend along even numbered and odd numbered columns. The plate lines in the even numbered columns are electrically connected to at least two of the conductive patterns in the even numbered rows and are electrically isolated from the conductive patterns in the odd numbered rows. The plate lines in the odd numbered columns are electrically connected to at least two of the conductive patterns in the odd numbered rows and are electrically isolated from the conductive patterns in the even numbered rows.

23 Claims, 28 Drawing Sheets

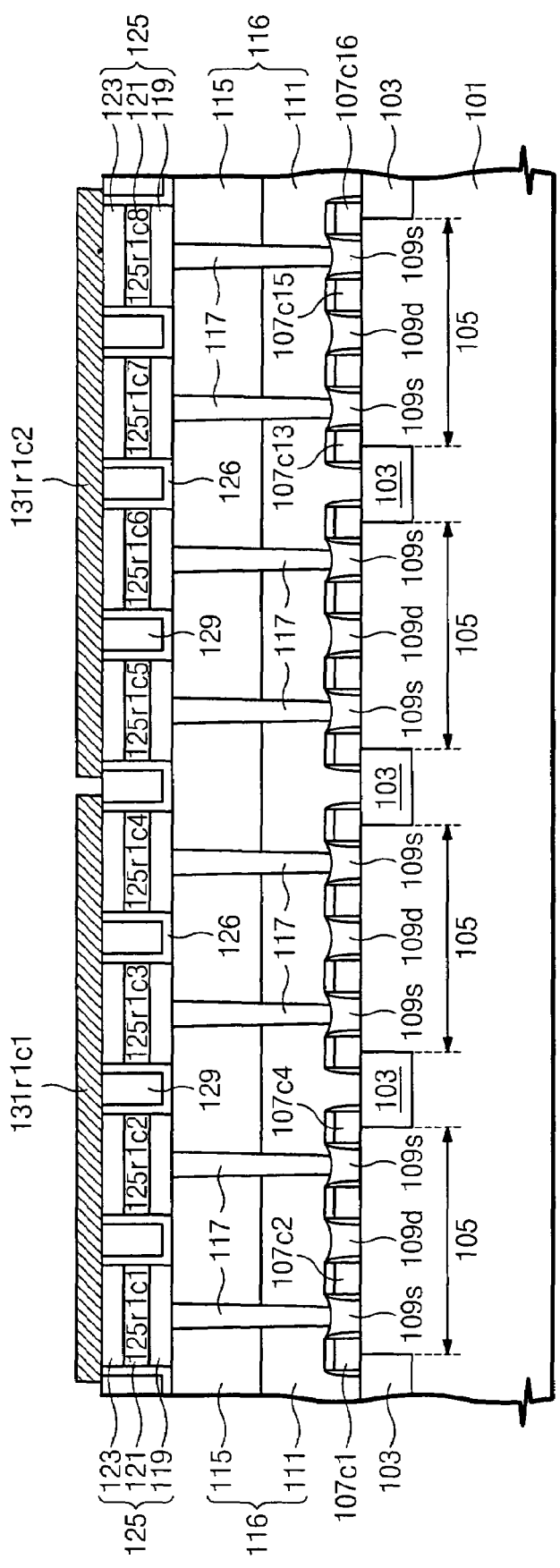

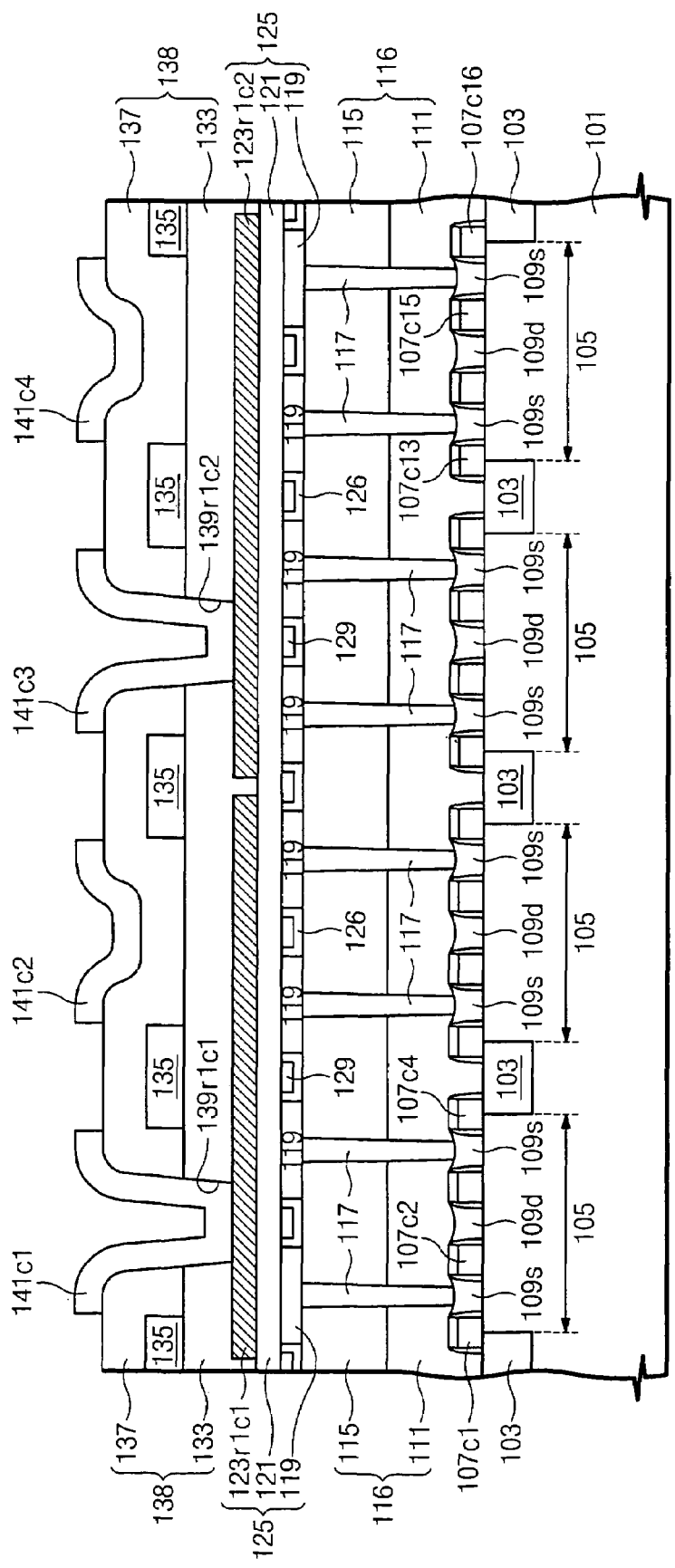

FERROELECTRIC MEMORY DEVICES

RELATED APPLICATION

This application claims the benefit of priority from Korean Patent Application No. 10-2003-0013748, filed Mar. 5, 2003, the disclosure of which is hereby incorporated herein by reference in its entirety as if set forth fully herein.

FIELD OF THE INVENTION

The present invention relates to memory devices and, more specifically, to ferroelectric memory devices.

BACKGROUND OF THE INVENTION

Ferroelectric memory devices use the polarization of ferroelectric materials to store data in a non-volatile manner when power is removed. The polarization of the ferroelectric materials can be set and reversed by applying an external electrical field. The ferroelectric materials can then retain their polarization after the electric field is removed.

Ferroelectric memory devices may operate with low voltages (e.g., less than 5V), high speed (e.g., about several nano-seconds), and low current (e.g., less than 1 microampere standby current). Because of these characteristics, ferroelectric memory devices may be regarded as a next-generation type of non-volatile memory. As with all types of non-volatile memories, it can be important to obtain highly integrated ferroelectric memory devices.

Various cell structures of the ferroelectric memory devices have been suggested. For example, a first structure is a 1TC structure in which a unit cell consists of one transistor and one capacitor, and a second structure is a 2TC in which a unit cell consists of two transistors and two capacitors. Some early ferroelectric memory devices used the 2TC structure, such as described in U.S. Pat. No. 4,873,664. Because of the need for increased integration, the 1TC structure, such as described in U.S. Pat. No. 5,978,251, became more widely used. As with DRAMs, bit line structures are classified into shared or open types (See U.S. Pat. No. 6,137,711) and folded type (See U.S. Pat. No. 6,151,243) according to the bit line structure for sensing data. A reading operation may be performed by applying a predetermined voltage pulse to one ferroelectric capacitor electrode opposite to the transistor via an interconnection (a plate line).

In this case, to fabricate high-integration ferroelectric memory device, preferably, one plate line may be connected to several capacitors. However, a ferroelectric layer of the ferroelectric capacitor can have several hundred or several thousand dielectric constants as compared with a dielectric layer used in DRAM. Accordingly, the number of capacitor that can be connected to one plate line can be limited. When several capacitors are connected to the plate line, the voltage pulse signal applied to the plate line exhibits a resistive-capacitive (RC) delay. As a result, a signal delay occurs which lowers the operational speed of the device and lowers the voltage applied to the ferroelectric capacitor. Because the number of ferroelectric capacitors connected to one plate line may be limited, circuits for selecting plate lines can increase, thereby increasing an associated chip size.

FIG. 1 is a plan view of the ferroelectric memory device applied to the shared bit line structure in conventional 1TC memory cell. FIG. 2 is an equivalent circuit of FIG. 1.

Referring to FIG. 1, several active regions 105, which are electrically insulated by an isolation region 103, are arranged along row and column directions in two-dimensions. Word lines 107 run along the row direction and are orthogonal to each of the active regions. A couple of word lines cross each of the active regions. Accordingly, each of the active regions may be classified as three parts, a drain region provided by the active region between a couple of the word lines, and two source regions provided by the active regions on both sides of a couple of the word lines. Bit lines 111a and 111b run between the active regions and are orthogonal to the word lines 107. Each of the bit lines is electrically connected through a drain contact pad 109b to the drain region. The ferroelectric capacitors 113c11, 113c12, 113c21, 113c22, 113c31, 113c32, 113c41, 113c42 are electrically connected through a source contact pad 109a to the source region corresponding to the ferroelectric capacitors 113. Plate lines 115a through 115d are parallel to the word line 107 and orthogonal to the bit line 111. Each of the plate lines 115a–d is electrically connected to each of the capacitors along a column direction. As shown, plate line 115a is electrically connected to the ferroelectric capacitors 113c11, 113c12.

In the ferroelectric memory device having a conventional shared bit line structure, each of the plate lines is electrically connected to several ferroelectric capacitors along a column and insulated from the ferroelectric capacitors arranged along neighboring columns. As shown, the plate line 115a is electrically connected to the ferroelectric capacitors 113c11 and 113c12 arranged along the same column. Ferroelectric capacitors 113c21 and 113c22 arranged along the same column are electrically connected to the plate line 115b. Additionally, each of the bit lines control operation of the ferroelectric capacitors arranged along a row. As shown, the bit line 111a controls operation of the ferroelectric capacitors 113c11, 113c12, 113c31 and 113c41 in the same row.

Referring to FIG. 2, unit memory cell MC0 includes transistor N0 and ferroelectric capacitor CF0. The gate of the transistor N0 is connected to the word line WLi, the source is connected to the bit line BLi and the drain is connected to one electrode of the ferroelectric capacitor CF0. The other electrode of the ferroelectric capacitor is connected to the plate line PLi.

Memory cells MC0 are arranged in matrix shape. Memory cells connected to the same bit line are connected to each different plate line $PL_i$ (i numbered plate line) and $PL_i+1$ respectively.

FIG. 3 is plan view of a ferroelectric memory device having a folded bit line structure in a conventional memory cell array having a 1TC structure. FIG. 4 is an equivalent circuit of FIG. 3.

Referring to FIG. 3, active regions 105 partially overlap. Each of the active regions of even numbered rows partially overlap two adjacent active regions of odd numbered rows. A couple of the word lines 107 extend along columns and are on each of the active regions. Accordingly, each of the active regions may be classified into three parts, a drain region between a couple of the word lines, and two source regions on both sides of the word lines. Bit lines 111 cross above isolation regions 103 between the active regions and are orthogonal to the word lines. Each of the bit lines is electrically connected through the drain contact pad 109b to the drain region. Ferroelectric capacitors 113 are electrically connected through source contact pads 109a to the source region corresponding to the ferroelectric capacitors. Plate lines 115 are parallel to the word line 107 and orthogonal to the bit line 111. Each of the plate lines 115 is electrically connected to each of the capacitors along a column. In contrast to the ferroelectric memory device having shared bit line structure, the active regions herein partially overlap. Accordingly, the ferroelectric capacitors in a column under a certain plate line are operated by the word lines in different columns.

Referring to FIG. 4, one memory cell is operated by two neighboring bit lines $BL_i$ and $BL_i+1$. The capacitor of the memory cell, which is connected to the word lines $WL_i$ and $WL_i+1$ respectively, is commonly connected to one plate line $PL_i$.

SUMMARY OF THE INVENTION

According to some other embodiments of the present invention, a ferroelectric memory device includes a semiconductor substrate, ferroelectric capacitors, and plate lines. Each of the ferroelectric capacitors include a bottom electrode, a ferroelectric layer, and an upper electrode layer. The ferroelectric capacitors are arranged in rows and columns on the semiconductor substrate. The plate lines are in columns. Each of the plate lines is electrically connected to a plurality of the ferroelectric capacitors.

In some further embodiments of the present invention, the ferroelectric memory device can include conductive patterns. Each one of the conductive patterns may be on and electrically connected to at least four adjacent ferroelectric capacitors in a row. The plate lines may be on and electrically connected to the conductive patterns opposite to the ferroelectric capacitors. The conductive patterns may be electrically connected to at least two adjacent rows of four adjacent ferroelectric capacitors. Each of the plate lines in the even numbered columns may be electrically connected to at least two conductive patterns in the even numbered rows and electrically isolated from the conductive patterns in the odd numbered rows, and each of the plate lines in the odd numbered columns may be electrically connected to at least two conductive patterns in the odd numbered rows and electrically isolated from the conductive patterns in the even numbered rows.

Some other embodiments of the invention provide methods for fabricating ferroelectric memory devices. A lower insulation layer is formed on a semiconductor substrate. Ferroelectric capacitors are formed in rows and columns on the lower insulation layer. Conductive patterns are formed so that each one is electrically connected to a plurality of ferroelectric capacitors that are adjacent along a row. An upper insulation layer is formed on the semiconductor substrate. Plate lines are formed columns. Each of the plate lines is electrically connected through via holes in the upper insulation layer to the conductive patterns. At least two of the plate lines are on each of the conductive patterns.

BRIEF DESCRIPTION OF THE DRAWINGS

FIG. 6A through FIG. 9A are plan views illustrating methods for fabricating the ferroelectric memory device shown in FIG. 5A.

FIG. 6B through FIG. 9B are cross-sectional views corresponding to FIG. 6A through FIG. 9A and are cross-sectional views taken A–A' of FIG. 5A.

FIG. 11B is a cross-sectional view taken along A–A' in FIG. 11A.

DETAILED DESCRIPTION OF THE INVENTION

Figure 1:
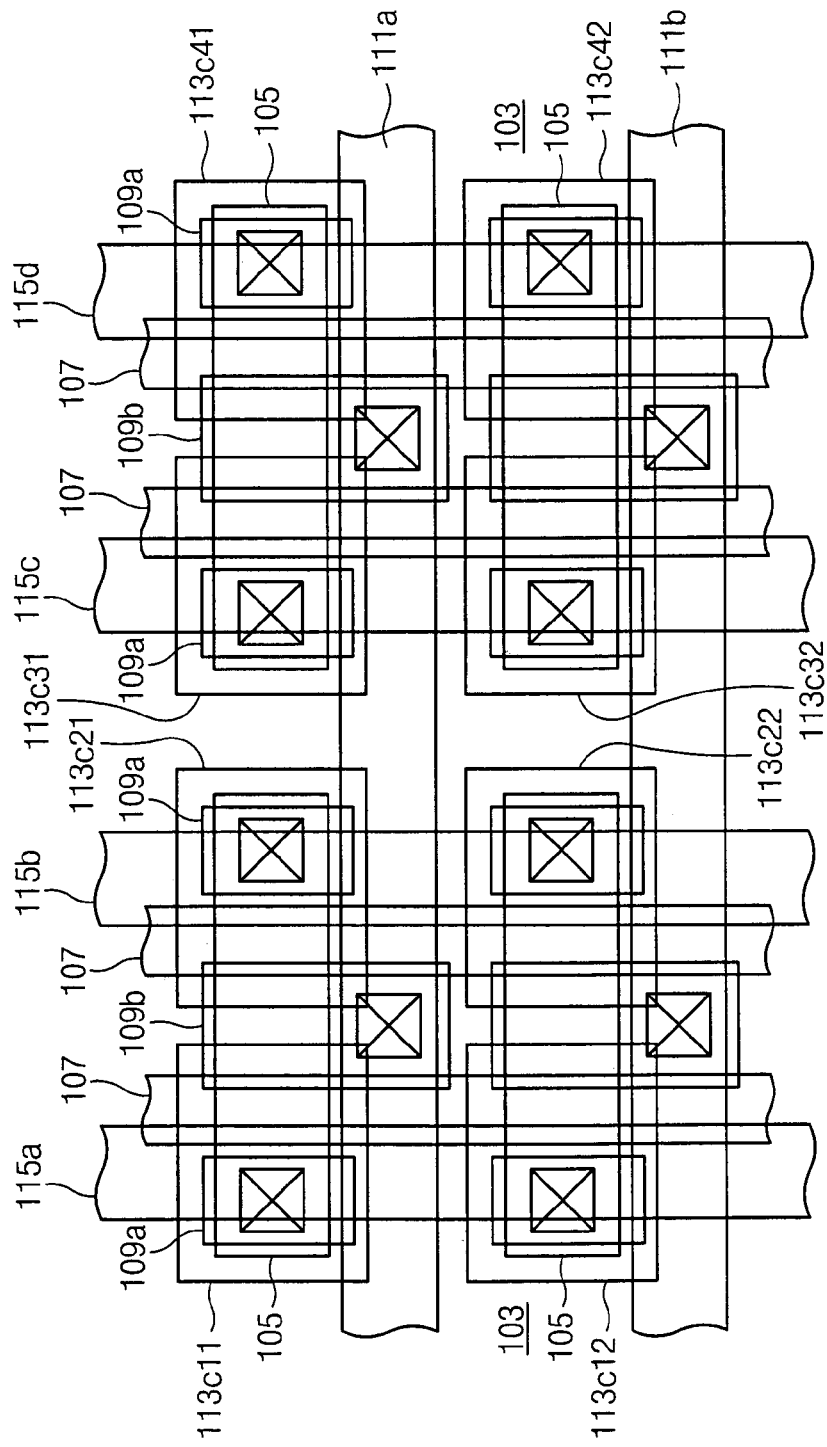
FIG. 1 is a schematic plan view of a prior art ferroelectric memory device.
Figure 2:
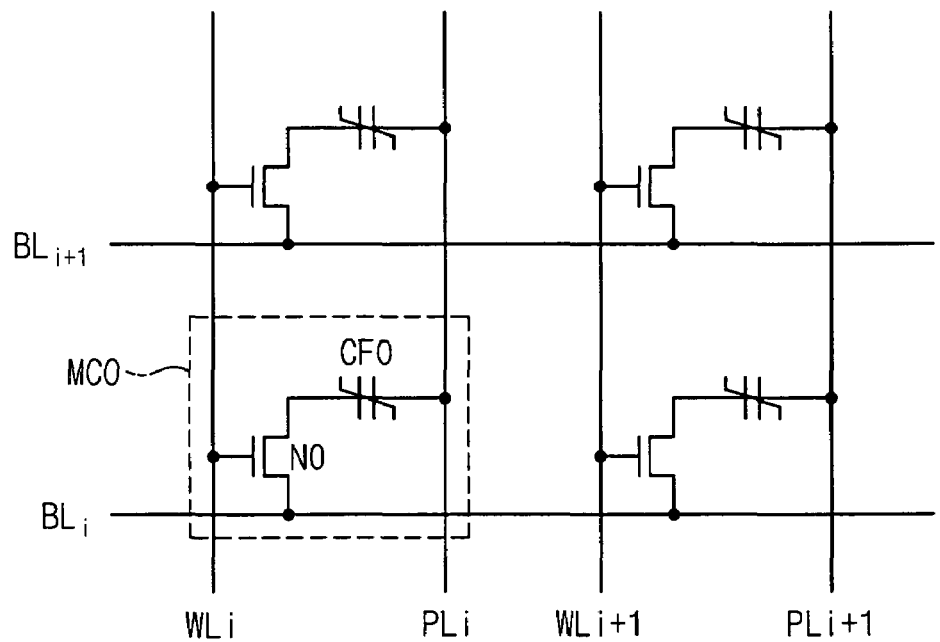
FIG. 2 is an equivalent circuit view of FIG. 1 according to the prior art.
Figure 3:
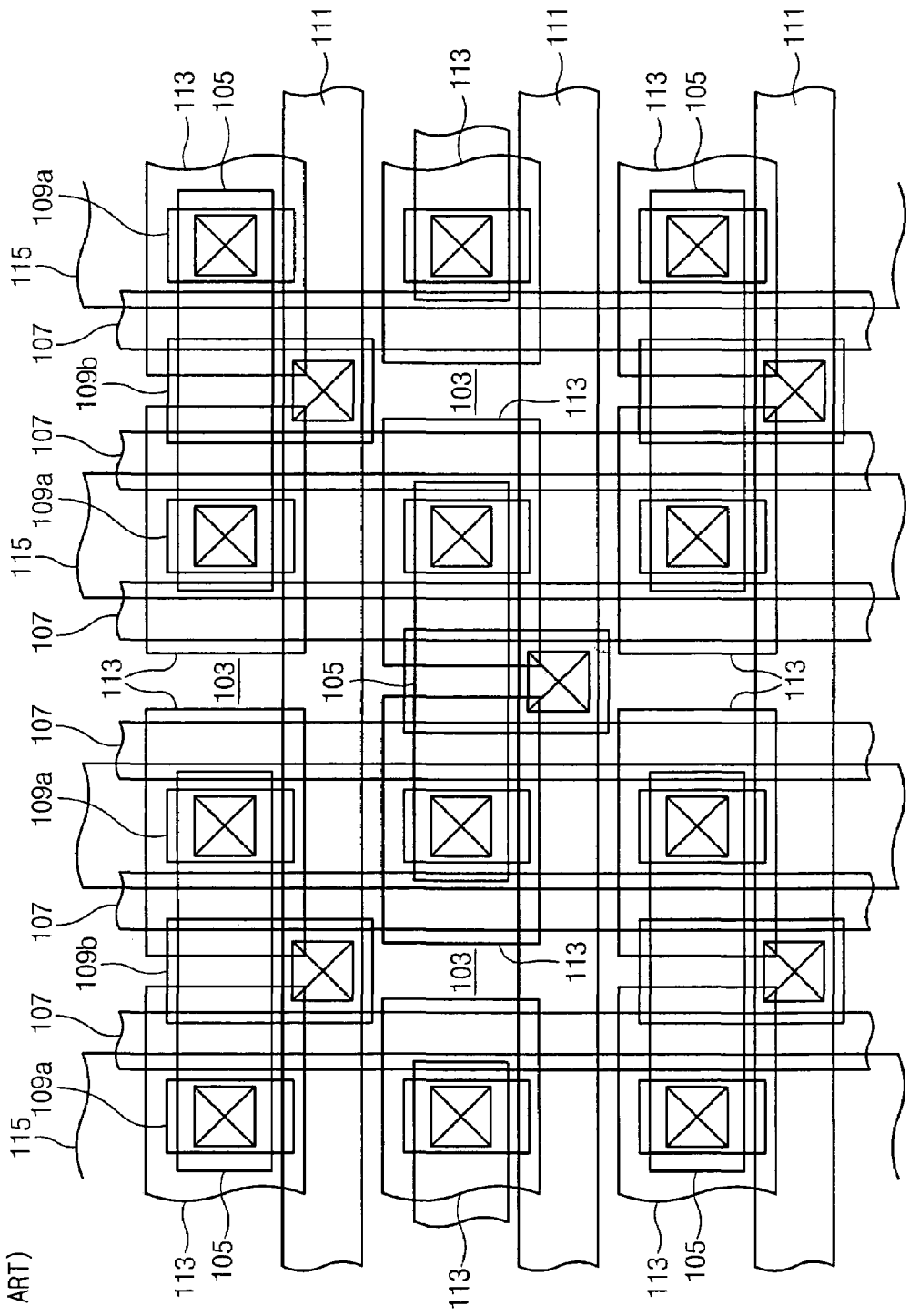
FIG. 3 is a schematic plan view of a prior art ferroelectric memory device.
Figure 4:
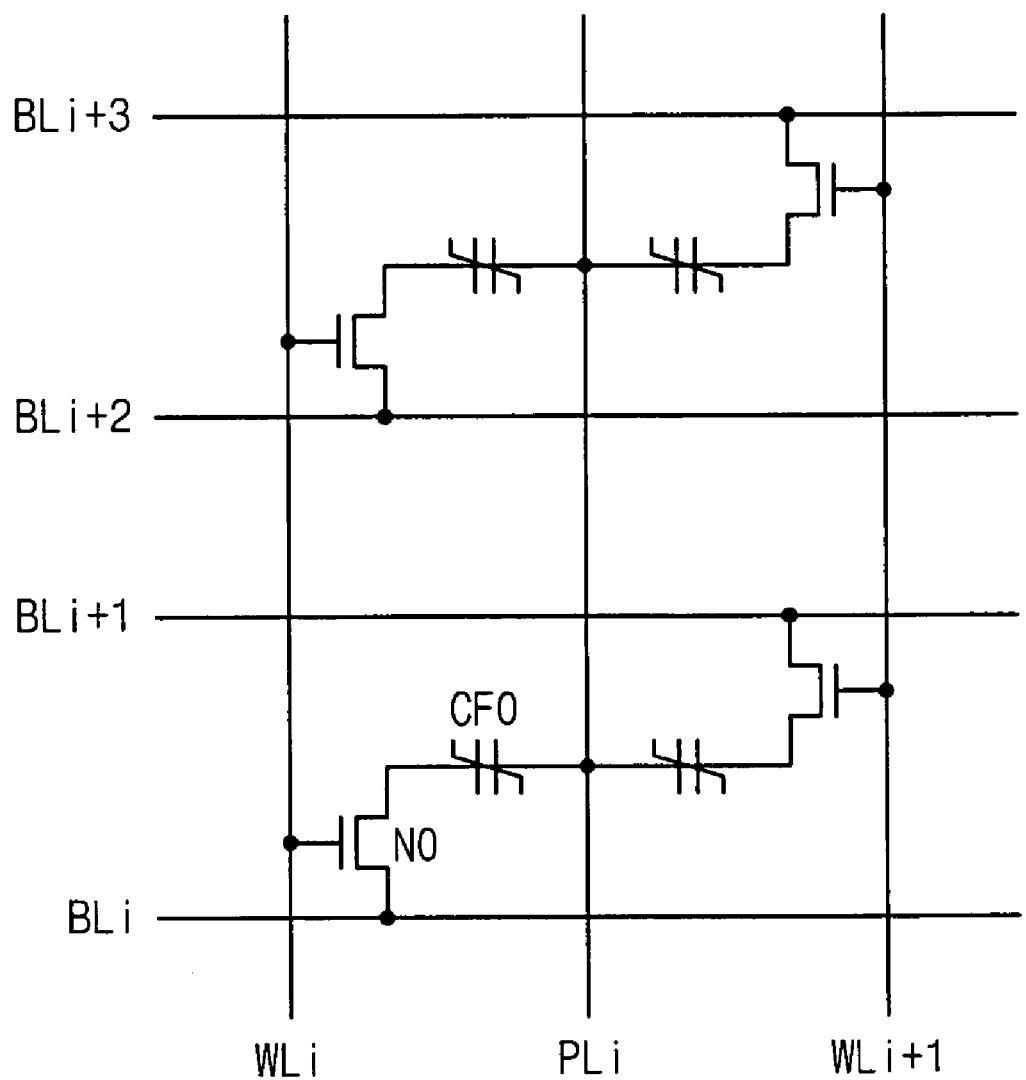
FIG. 4 is an equivalent circuit view of FIG. 3 according to the prior art.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when elements are referred to as being connected to one another, this connection may be direct or via one or more intervening elements. In contrast, when an element is referred to as being "directly connected" or "directly coupled" to another element, there are no intervening elements present. In the drawings, the thickness of the layers and regions are exaggerated for clarity.

It will be understood that although the terms first, second, etc. are used herein to describe various elements, these elements should not be limited by these terms. These terms are only used to distinguish one element from another element. Thus, a first element discussed below could be termed a second element and similarly, a second element may be termed a first element without departing from the teachings of the present invention.

It will further be understood that the terms "odd" and "even" are used herein to distinguish one row/column from another adjacent row/column. Accordingly, a sequence of rows/columns are referred to herein as alternating odd numbered and even numbered rows/columns. Thus, an odd numbered row/column discussed below could be termed an even numbered row/column and similarly, an even numbered row/column may be termed an odd numbered row/column without departing from the teachings of the present invention.

Figure 5A:
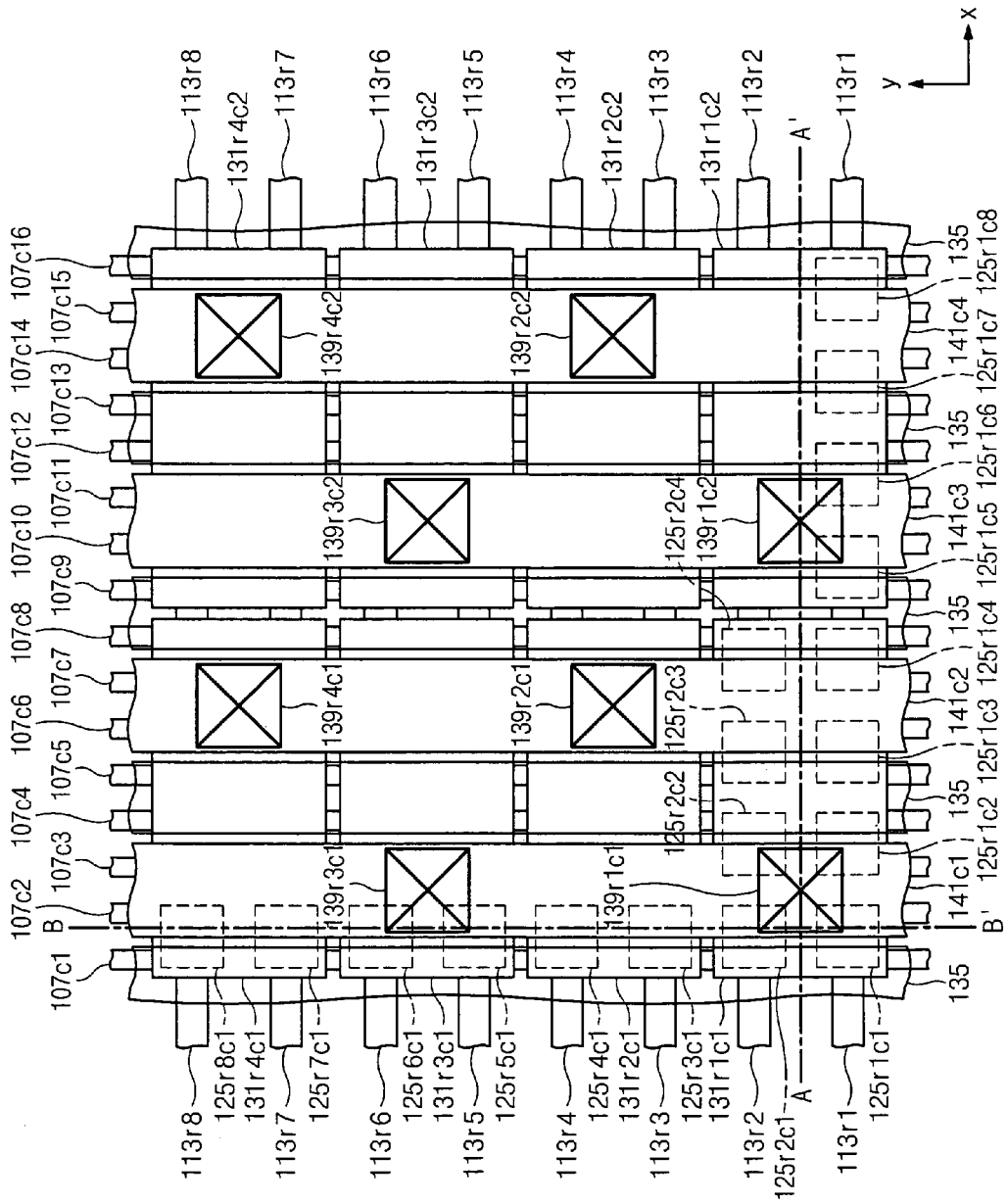
FIG. 5A is a schematic plan view of a part of cell array region of a ferroelectric memory device with a folded bit line structure according to first embodiments of the present invention.
Figure 5B:
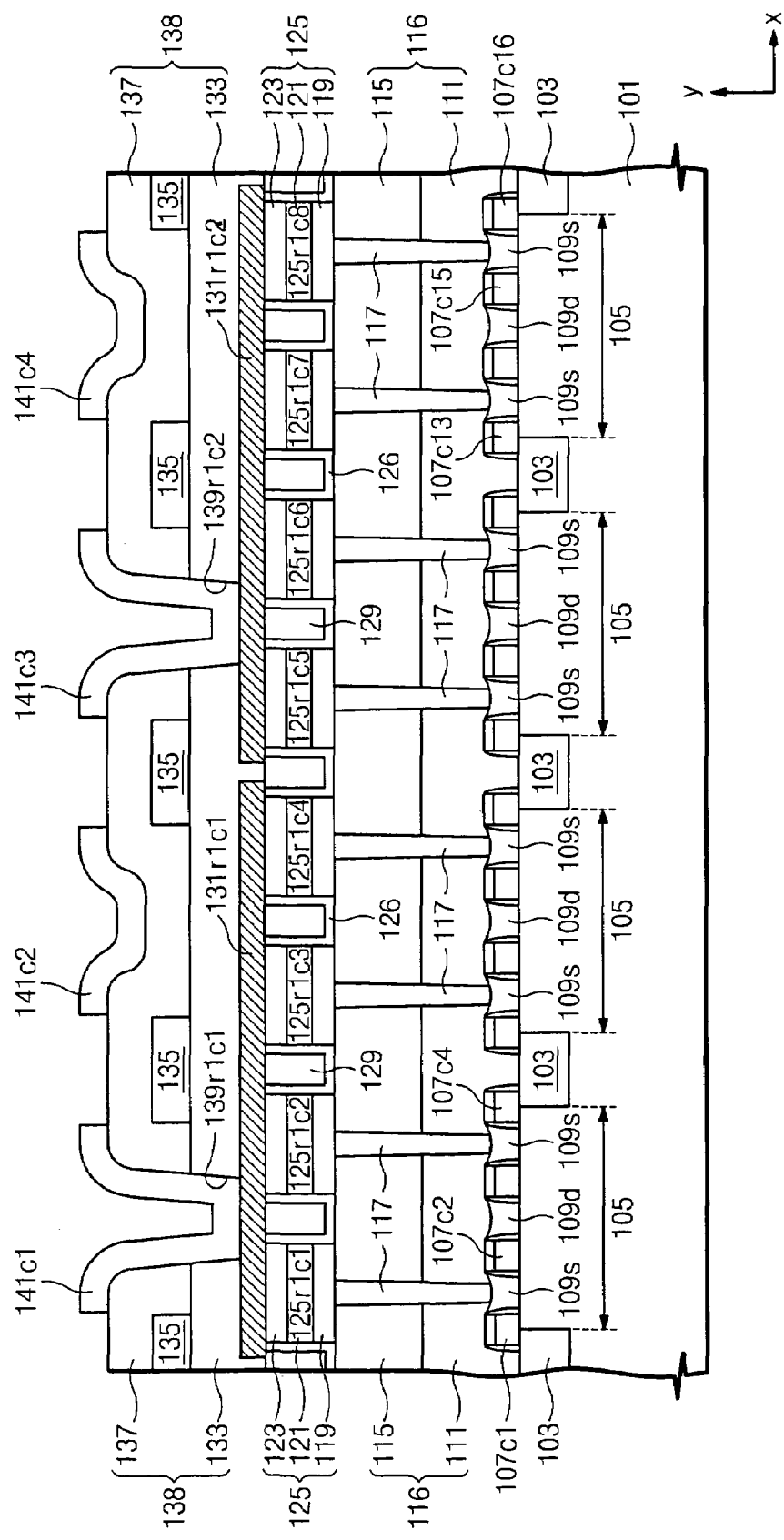
FIG. 5B is a cross-sectional view taken along A–A' of FIG. 5A.
Figure 5C:
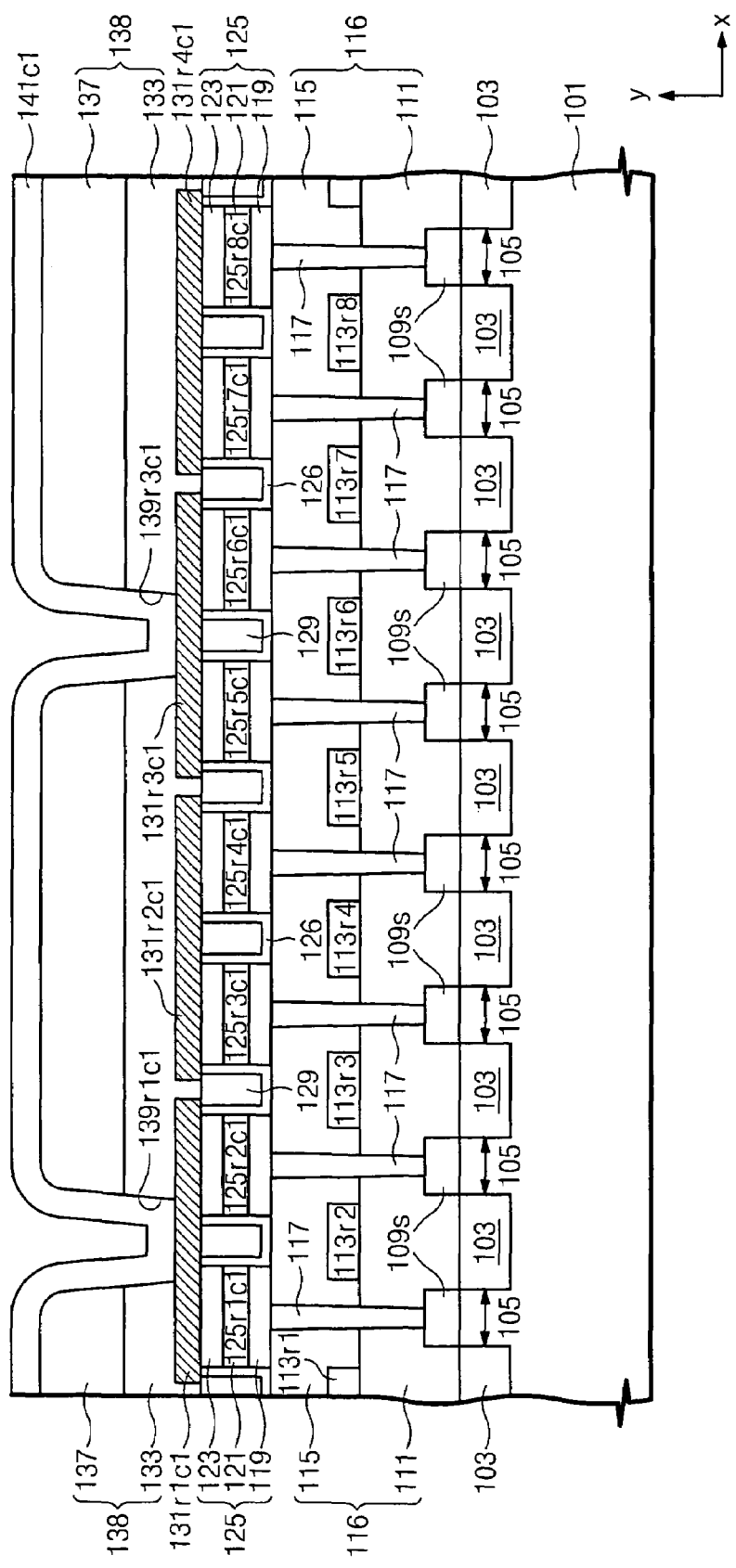
FIG. 5C is a cross-sectional view taken along B–B' of FIG. 5A.

FIG. 5A is a schematic plan view of a part of a cell array region of a ferroelectric memory device having a folded bit line structure according to first embodiments of the present invention. FIGS. 5B–C are cross-sectional views taken along line A–A' and line B–B' in FIG. 5A. Line A–A' is parallel to a bit line and is orthogonal to a word line and a plate line. Line B–B' is orthogonal to the bit line.

Referring to FIGS. 5A–C, an isolation region 103 is on a semiconductor substrate 101. The isolation region 103 defines a plurality of active regions arranged in two dimensions. The active regions in even numbered columns (or odd numbered columns) completely overlap each other, and partially overlap each other in even numbered rows and odd numbered rows (see FIG. 6A). The size of the active regions 105 in the row direction (x-direction) is larger than the size of the active regions 105 in the column direction (y-direction). Word lines (i.e., gate lines) 107c1–107c16 are arranged in columns. A couple of the word lines 107c1–107c16 intersect the active regions 105. As a result, the active regions 105 are divided into three parts. A common drain region is formed on the active region between a couple of gate electrodes, and source regions are formed on the active regions of both sides of the common drain region. Therefore, cell transistors are formed on points where the word lines 107c1–107c16 cross the active regions 105. Capacitor contact pads 109s and bit line contact pads 109d are on the source/drain regions.

A lower insulation layer 116 covers an entire surface of the semiconductor substrate including the cell transistors and the contact pads 109s, 109d. For example, the lower insulation layer 116 may be a dual layer including a first lower interlayer dielectric layer 111 and a second lower interlayer dielectric layer 115 that are sequentially stacked. A plurality of bit lines 113r1–113r8 orthogonal to the word lines 107c1–107c16 are arranged on the first lower interlayer dielectric layer 115. The bit lines 113r1–113r6 are electrically connected to the bit line contact pad 109d through a bit line contact hole penetrating the first lower interlayer dielectric layer 111. Therefore, the bit lines 113r1–113r6 are electrically connected to the drain region. Contact plugs 117 are disposed in the lower insulation layer 116 so as to penetrate the lower insulation layer 116 and be electrically connected to the capacitor contact pads 109s.

A plurality of ferroelectric capacitors 125 are arranged in two dimensions, i.e, along rows and column on the semiconductor substrate 101 including the contact plugs 117. Sixty four ferroelectric capacitors arranged in an 8 by 8 array are shown in FIG. 5A. Referring to FIG. 5B, eight ferroelectric capacitors 125r1c1, 125r1c2, 125r1c3, 125r1c4, 125r1c5, 125r1c6, 125r1c7 and 125r1c8) are disposed in a row. Two ferroelectric capacitors arranged in row direction are electrically connected to two source regions of the each active region 105. Referring to FIG. 5C, ferroelectric capacitors 125r1c1, 125r2c1, 125r3c1, 125r4c1, 125r5c1, 125r6c1, 125r7c1 and 125r8c1 are in a column.

Ferroelectric capacitors 125 include a bottom electrode 119, a ferroelectric layer pattern 121 and an upper electrode 123. The bottom electrode 119, the ferroelectric layer pattern 121 and the upper electrode 123 are sequentially staked. The bottom electrodes 119 are disposed on the contact plugs 117 and are electrically connected to the contact plugs 117. Consequently, the ferroelectric capacitor 125 is electrically connected through the contact plug 117 to the source region. A supporting insulation layer 129 fills an empty space between the ferroelectric capacitors 125.

Furthermore, a hydrogen barrier layer pattern 126 may be interposed between the supporting insulation layer 129 and sidewall of the ferroelectric capacitors 125. The hydrogen barrier layer pattern 126 may be $TiO_2$, $Al_2O_3$ and/or $Si_3N_4$ or a combination layer of $TiO_2$, $Al_2O_3$ and/or $Si_3N_4$. Accordingly, hydrogen atoms may be prevented from penetrating into the ferroelectric capacitors 125. If hydrogen atoms are diffused into the ferroelectric capacitors 125, reliability of the ferroelectric pattern 121 may be reduced. For example, hydrogen atom reacts with oxygen atom in a ferroelectric layer such as a PZT layer (Pb, Zr, and/or $TiO_3$), thereby forming an oxygen vacancy in the PZT layer. The oxygen vacancy may reduce the polarization characteristic of a ferroelectric memory device, and may cause a malfunction of the device. Additionally, when the hydrogen atoms are captured at the interfaces between the ferroelectric pattern and upper/bottom electrodes, an energy barrier therebetween may become low, and leakage current characteristic of the ferroelectric capacitor 125 may deteriorate. Consequently, the hydrogen barrier layer pattern 126 may improve the characteristic and reliability of the ferroelectric capacitor 125.

A plurality of local conductive patterns 131 are arranged in rows and columns on the ferroelectric capacitors 125 and the supporting insulation layer 129. Referring to FIG. 5A, eight local conductive patterns 131r1c1, 131r1c2, 131r2c1, 131r2c2, 131r3c1, 131r3c2, 131r4c1 and 131r4c2 are arranged on an 8*8 array of the ferroelectric capacitors 125. Each of the local conductive patterns 131 overlap eight (i.e., 4*2) of the ferroelectric capacitors 125 in two adjacent rows of four of the capacitors 125. As shown, the local conductive pattern 131r1c1 is electrically connected to four ferroelectric capacitors 125r1c1, 125r1c2, 125r1c3 and 125r1c4 in a first row and four ferroelectric capacitors 125r2c1, 125r2c2, 125r2c3 and 125r2c4 in an adjacent second row. In this case, among the four capacitors 125r1c1, 125r1c2, 125r1c3 and 125r1c4 in the first row, two of the capacitors 125r1c1 and 125r1c2 are in the same active region, and another two of the capacitors 125r1c3 and 125r1c4 are in another active region. In addition, among for capacitor 125r2c1, 125r2c2, 125r2c3 and 125r2c4 in second row, the capacitors 125r2c2 and 125r2c3 are in another same active region, and the ferroelectric capacitor 125r2c1 and the ferroelectric capacitor 125r2c4 are in a different active region adjacent to opposite sides of another active region of the ferroelectric capacitors 125r2c2 and 125r2c3.

Each of the local conductive patterns 131 may include a metal layer, a conductive metal oxide layer and a conductive metal nitride layer, or a combination layer of the metal layer, the conductive metal oxide layer and the conductive metal nitride layer. For example, the local conductive patterns 131 may be formed of Titanium aluminum nitride layer (TiAlN), Titanium layer (Ti), Titanium nitride (TiN), Iridium layer (Ir), Iridium oxide layer (IrO), Platinum layer (Pt), Ruthenium layer (Ru), Ruthenium oxide layer (RuO$_2$) and Aluminum layer (Al) or a combination thereof.

As shown in FIG. 5B and FIG. 5C, each local conductive pattern 131 is in direct contact with upper electrodes 123 of a plurality of the ferroelectric capacitors 125.

An entire surface of the semiconductor substrate including the local conductive patterns 131 is covered with an upper insulation layer 138. In this case, the upper insulation layer 138 may be a dual layer of a first upper interlayer dielectric layer 133 and a second upper insulation layer 137 that are sequentially stacked.

Furthermore, a plurality of main word lines 135 may be disposed between the first upper interlayer dielectric layer 133 and the second upper interlayer dielectric layer 137. The main word lines 135 are in columns parallel to the word line 107. The main word lines 135 control four word lines 107 through respective decoders.

Plate lines 141c1–141c4 are on the upper insulation layer 138 between the main word lines 135. The plate lines 141c1–141c4 are orthogonal to the bit lines 113r1–113r8 and parallel to the word lines 107c1–107c16. A couple of the plate lines 141c1–141c4 orthogonally intersect each local pattern. For example, plate line 141c1 (an odd numbered plate line) is electrically connected to the local conductive patterns 131r1c1 and 131r3c1 in odd numbered rows. The plate line 141c1 is electrically connected to the local insulation patterns 131r1c1 and 11r3c1 through via holes (i.e., openings) 139r1c1 and 139r3c1 penetrating the upper insulation layer 18. The plate line 141c3 is electrically connected to the local conductive pattern 131r1c2 and 131r3c2 through via holes 139r1c2 and 139r3c2 penetrating the upper insulation layer 138. In addition, the second plate line (even plate line 141c2) among the couple of plate lines is electrically connected to even row local conductive patterns 131r2c1 and 131r4c1. The plate line 141c2 is electrically connected to the local conductive patterns 131r2c1 and 131r4c1 through via holes 139r2c2 and 139r4c2. The plate line 141c4 is electrically connected to the local conductive patterns 131r2c2 and 131r4c2 through via holes 139r2c2 and 139r4c2 penetrating the upper insulation layer 138.

In the ferroelectric memory device according to some embodiment of the present invention, each local conductive pattern is in directly contact and electrically connected with the upper electrodes of two rows of four of the ferroelectric capacitor 125. In addition, the local conductive patterns 131 arranged in a column are orthogonal to two neighboring plate lines 141 and electrically connected to mutually different plate lines 141 in rotation. One local conductive pattern is simultaneously electrically connected to the ferroelectric capacitors 125 that are arranged in a row direction and belong to different active regions.

Accordingly, referring to FIG. 5A, if a word line (e.g., word line 107c1) and a plate line (e.g., an odd plate line, such as plate line 141c1) are activated, four capacitors among sixteen capacitors connected to odd local conductive patterns 131r1c1 and 131r3c1 (that is, the first, the second, the fifth and the sixth capacitors 125r1c1, 125r2c1, 125r5c1 and 125r6c1 in the first column) are selected. In contrast, in a conventional device all sixteen capacitors in the first row are selected because one plate line is connected to all the ferroelectric capacitors arranged in one column.

Consequently, the number of the ferroelectric capacitors that are connected to one plate line may be increased while reducing signal delay. Accordingly, the number of plate line may be reduced in a memory cell array, and an associated reduction in the plate line selection circuit may be provided so that chip dimensions may be reduced.

Referring to FIG. 6A through FIG. 9A, and FIG. 6B through FIG. 9B, a methods for fabricating the ferroelectric memory devices shown in FIGS. 5A–C is now more fully described hereinafter according to some embodiments of the present invention.

Figure 6A:
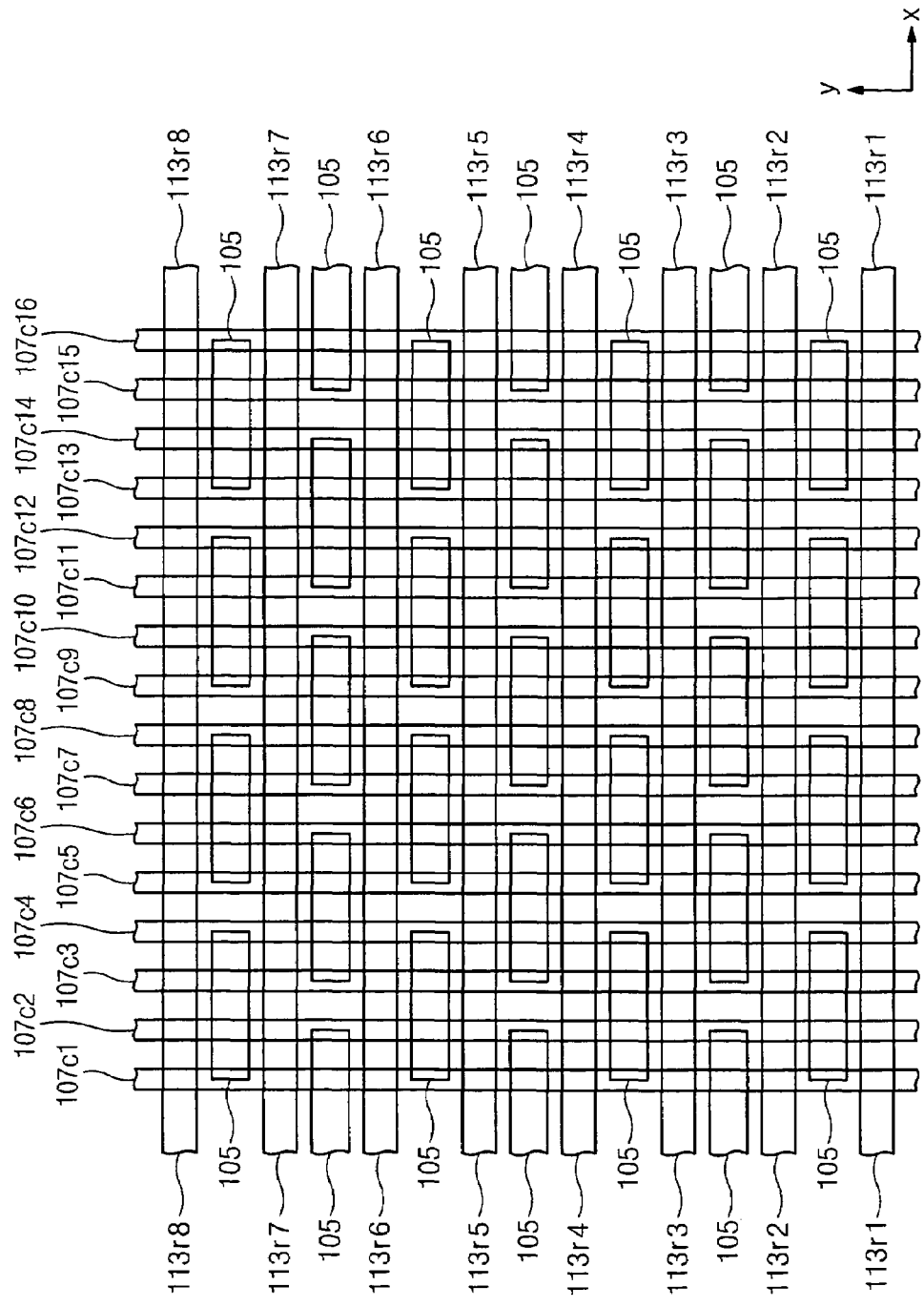

FIG. 6A through FIG. 9A are top plan views. FIG. 6B through FIG. 9B are cross-sectional views taken along line A–A' in FIG. 5A. Referring to FIG. 6A and FIG. 6B, an isolation region 103 is formed in a predetermined region of the semiconductor substrate 101, and forming a plurality of active regions 105. Odd rows of the active regions 105 are partially overlapped with even rows of the active regions 105. A gate insulation layer, a gate conductive layer and a capping insulation layer are sequentially formed on the surface of the semiconductor substrate including the active regions 105. A plurality of parallel gate patterns are formed by patterning the capping insulation layer, the gate insulation layer and the gate insulation layer successively. A plurality of parallel gate patterns cross over top of the active regions 105 and the isolation region 103. The gate patterns comprise a gate insulation pattern, a gate electrode 107 and a capping insulation pattern respectively. The gate insulation pattern, the gate electrode 107 and the capping insulation pattern are stacked sequentially. In this case, each of the active regions intersects with a couple of the gate electrodes 107. The gate electrode 107 serves as a word line. The word lines along a row (x-axis) may extend in the column direction (y-axis).

Impurity ions are implanted into the active regions 105 using the gate patterns and the isolation regions 103 as an ion implantation mask. As a result, three impurity regions are formed in each active region. In each active region, a center impurity region among three impurity regions is equivalent to a common drain region and the other two regions of the three impurity regions are equivalent to source regions. Accordingly, a couple of cell transistors are formed in each active region. Consequently, the cell transistors are arranged along row and column directions on the semiconductor substrate 101 in two dimensions. A spacer is formed on a lateral surface of the gate pattern.

Capacitor pads 109s and bit line pads 109d, which are electrically connected to the source and drain regions respectively, are formed. The capacitor pads 109s and the bit line pads 109d may be formed in a following process. An insulation layer is formed on the entire surface of the semiconductor substrate. Next, a contact hole is formed by patterning the isolation layer. The contact hole is filled with a conductive material. A first lower interlayer dielectric layer 111 is formed on the entire surface of the semiconductor substrate including the pads 109a and 109d. A bit line contact hole exposing the bit line pads 109d is formed by patterning the first lower interlayer dielectric layer 111. A conductive material is deposited on bit line contact holes and the first lower interlayer dielectric layer 111. Then, bit lines 113 (113r1, 113r2, . . . , 113r7 and 113r8) orthogonal to the word lines 107 (107c1, 107c2, 107c3, . . . , 107c14 and 107c16) are formed by patterning the conductive material.

A second lower interlayer dielectric layer 115 is formed on the entire surface of the semiconductor substrate including the bit lines 113. A lower insulation layer 116 includes the first and second lower interlayer dielectric layers 111 and 115. Contact holes that expose capacitor pads 109s are formed by patterning the first and second bottom interlayer dielectric layers 111 and 115. The contact holes are filled with a conductive material to form contact plugs 117.

Figure 7A:
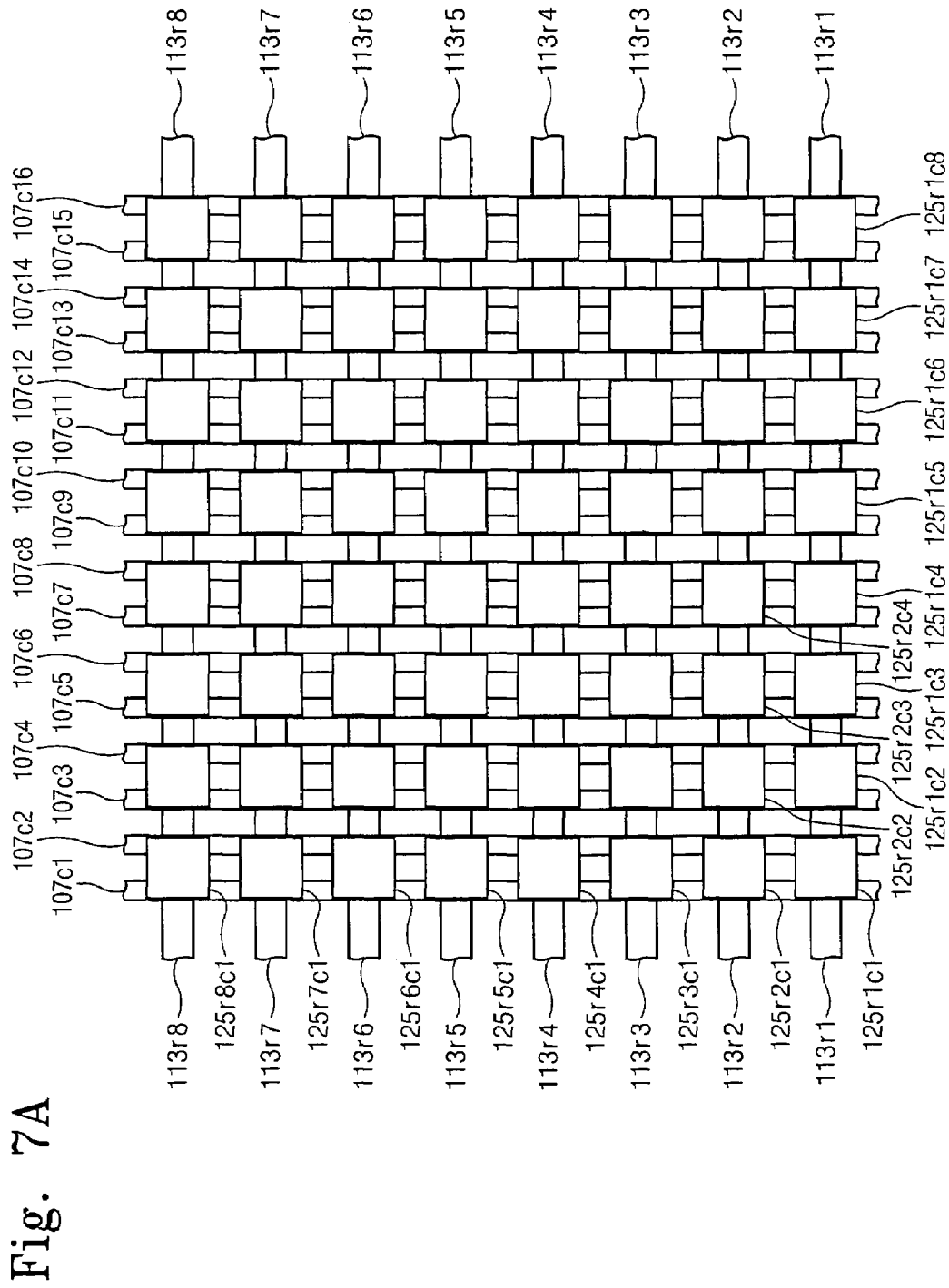
Figure 7B:
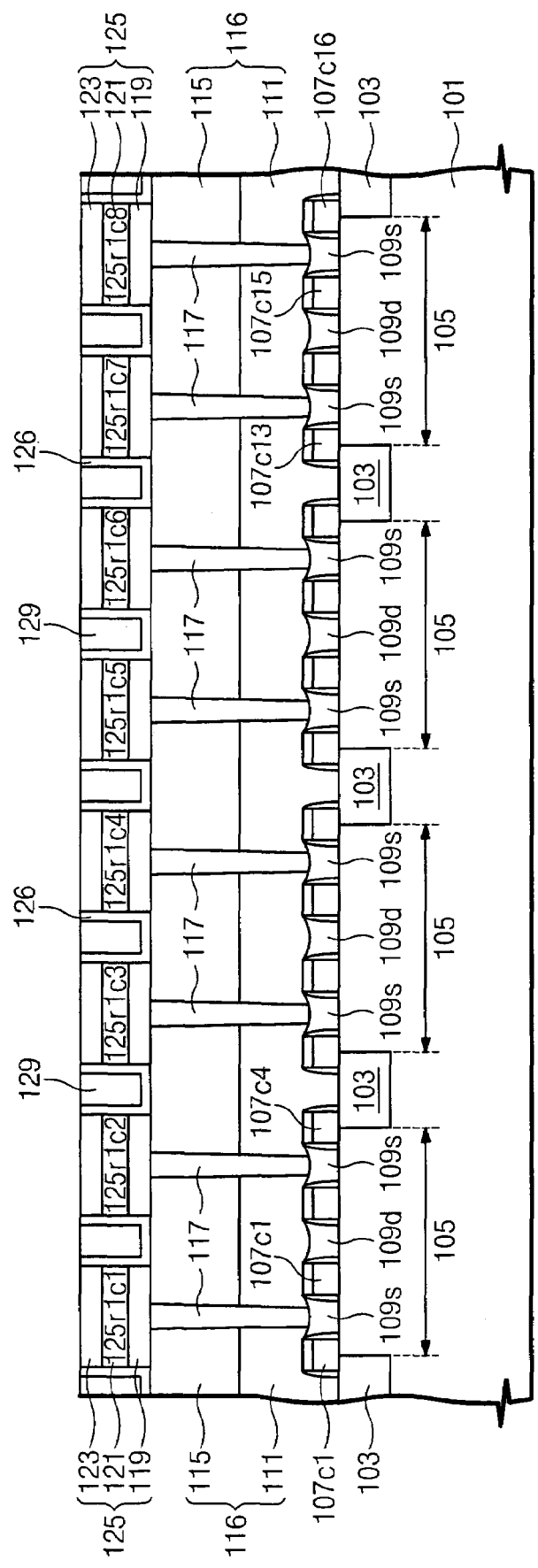

Next, referring to FIGS. 7A–B, a bottom electrode layer, a ferroelectric layer and an upper electrode layer are sequentially formed on the contact plugs 117 and the lower insulation layer 116. A plurality of ferroelectric capacitors 125, which are arranged along row and column directions in two dimensions, are formed by patterning the upper electrode layer, the ferroelectric layer and the bottom electrode layer successively. For example, sixty four capacitors (125$r$1$c$1, 125$r$1$c$2, ..., 125$r$1$c$7, 125$r$1$c$8, 125$r$2$c$1, 125$r$2$c$2, ..., 125$r$2$c$7, 125$r$2$c$8 ..., ..., 125$r$8$c$1, 125$r$8$c$2, ..., 125$r$8$c$7, 125$r$8$c$8) are formed in an eight by eight array arranged along row and column directions. Each of the ferroelectric capacitors 125 may include a bottom electrode 119, a ferroelectric layer pattern 121 and an upper electrode 123. The bottom electrode 119, the ferroelectric layer pattern 121 and the upper electrode 123 are sequentially stacked. Bottom electrodes 119 are in contact with the contact plugs 117 respectively. Consequently, the ferroelectric capacitors 125 are electrically connected to the source regions respectively. A supporting insulation layer 129 is formed on an entire surface of a product including the ferroelectric capacitors 124. A hydrogen barrier layer 126 can be formed conformally before forming the supporting insulation layer 129. The hydrogen barrier layer 126 may be formed of $TiO_2$, $Al_2O_3$ and/or $Si_3N_4$ or a combination layer of $TiO_2$, $Al_2O_3$ and/or $Si_3N_4$.

Next, the upper electrodes 123 are exposed by planarizing the supporting insulation pattern 129 and the hydrogen barrier pattern 126. The planarization process can be performed using chemical mechanical polishing method or etch back method. Accordingly, the hydrogen barrier pattern 126 and the supporting pattern 129 remain between the ferroelectric capacitors 125. The hydrogen barrier patterns 126 cover sidewalls of the ferroelectric capacitors 125 (i.e., sidewalls of the ferroelectric layer patterns 121). Therefore, hydrogen atoms may be prevented from diffusing into the ferroelectric patterns 121. If hydrogen atoms were to diffuse into the ferroelectric patterns 121, characteristics of the ferroelectric capacitors 125, such as polarization characteristic and leakage characteristic, may become deteriorated. Consequently, the hydrogen barrier pattern 126 may improve the characteristics of the ferroelectric capacitors 125.

Figure 8A:
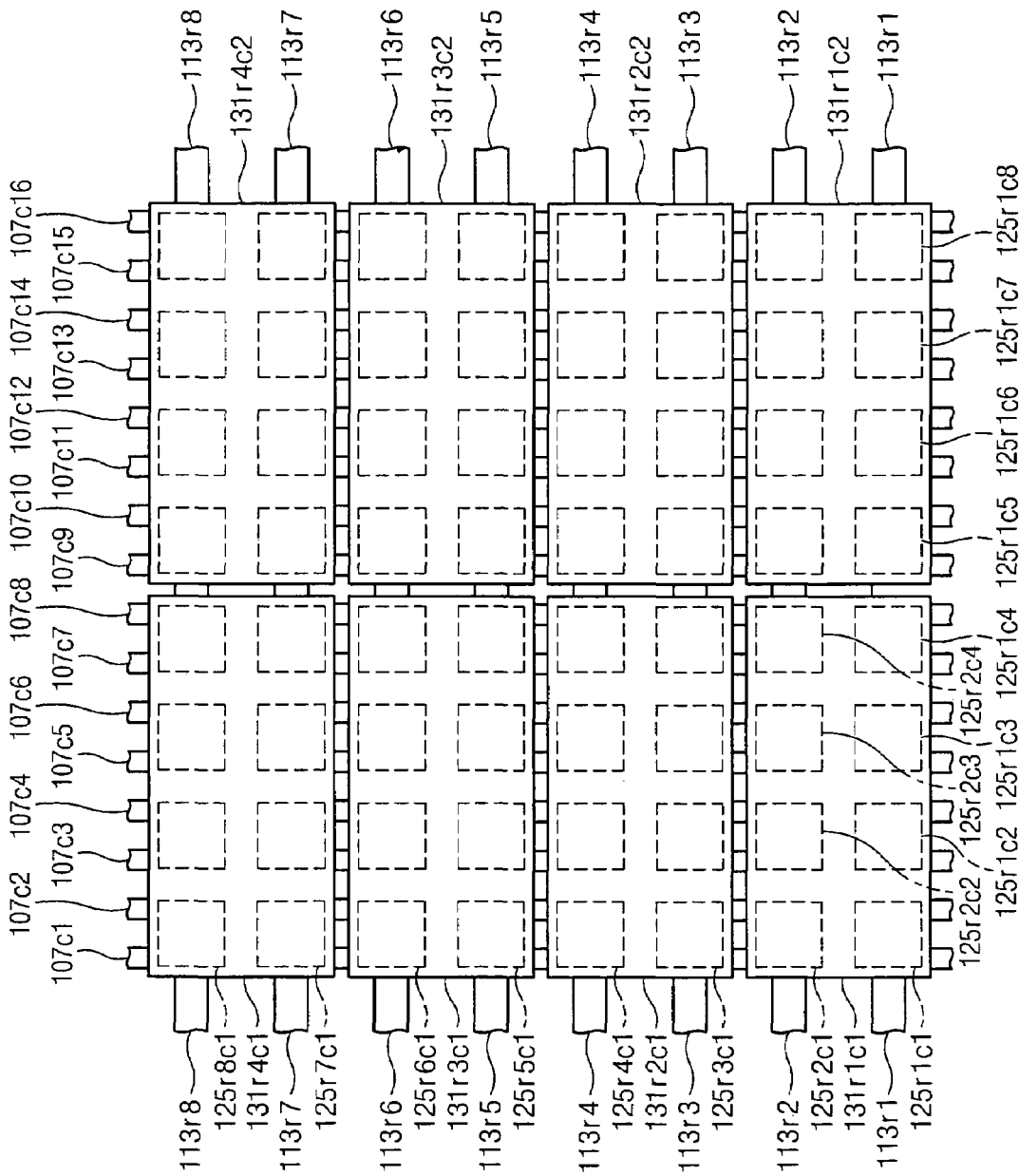

Next, referring to FIGS. 8A–B, a conductive material is deposited on a supporting insulation layer 129 and an upper electrode of the ferroelectric capacitors. Then, local conductive patterns 131, which are electrically connected to several upper electrodes commonly, are formed by patterning the conductive material. In FIGS. 8A–B, eight of the local conductive patterns 131$r$1$c$1, 131$r$1$c$2, 131$r$2$c$1, 131$r$2$c$2, 131$r$3$c$1, 131$r$3$c$2, 131$r$4$c$1 and 131$r$4$c$2 are shown, two in the row direction and four in the column direction. Each local conductive pattern is in directly contact with and electrically connects two adjacent rows of the upper electrodes (four in the row direction and two in the column direction). The local conductive patterns are arranged along row and column directions.

The local conductive patterns may be formed of a metal layer, a conductive metal oxide layer and a conductive metal nitride layer or a combination layer of the metal layer, the conductive metal oxide layer and the conductive metal nitride layer. For example, the local conductive patterns may be formed of Titanium aluminum nitride layer (TiAlN), Titanium layer (Ti), Titanium nitride (TiN), Iridium layer (Ir), Iridium oxide layer (IrO), Platinum layer (Pt), Ruthenium layer (Ru), Ruthenium oxide layer ($RuO_2$) and Aluminum layer (Al) or a combination thereof.

Figure 9A:
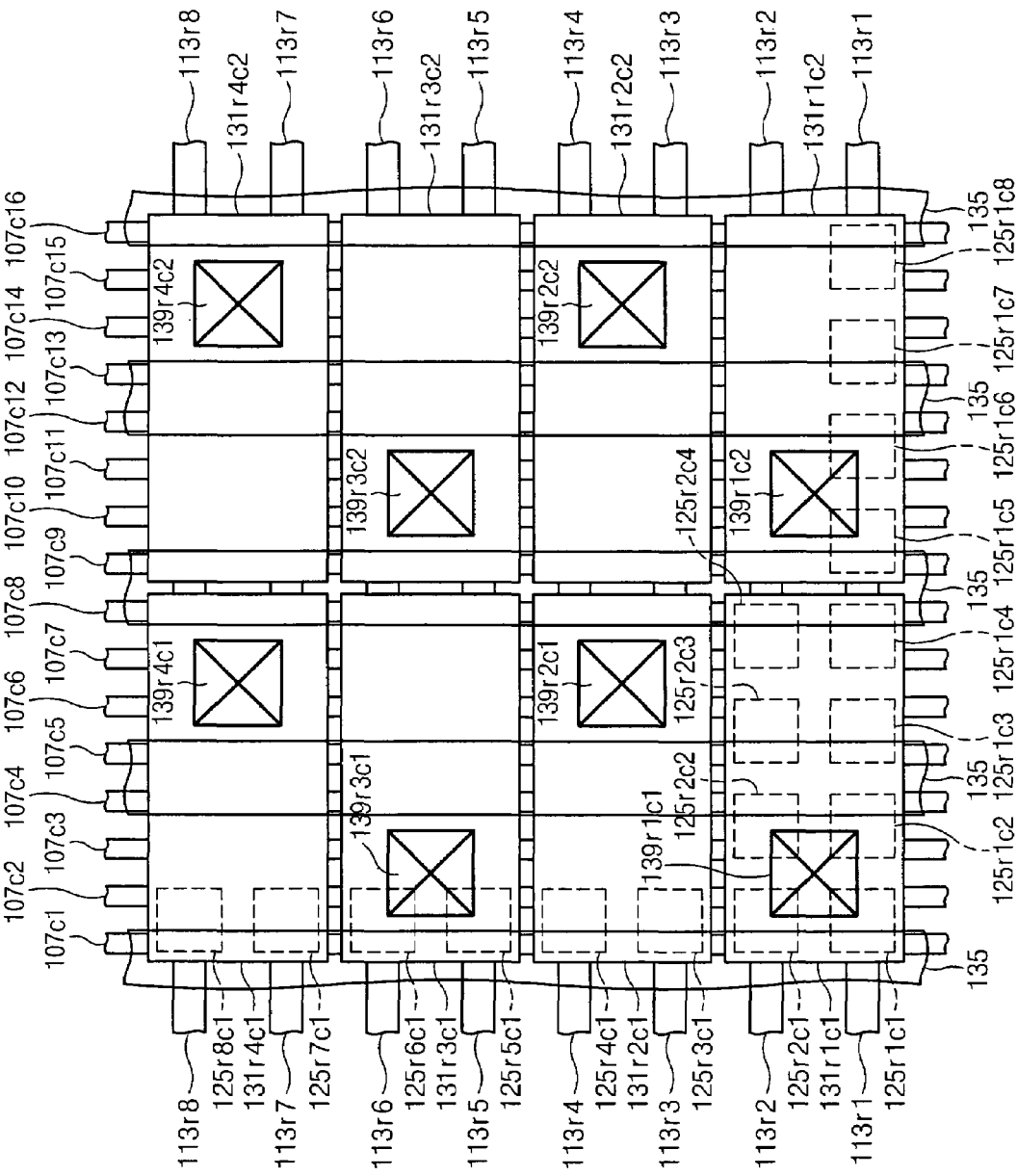
Figure 9B:
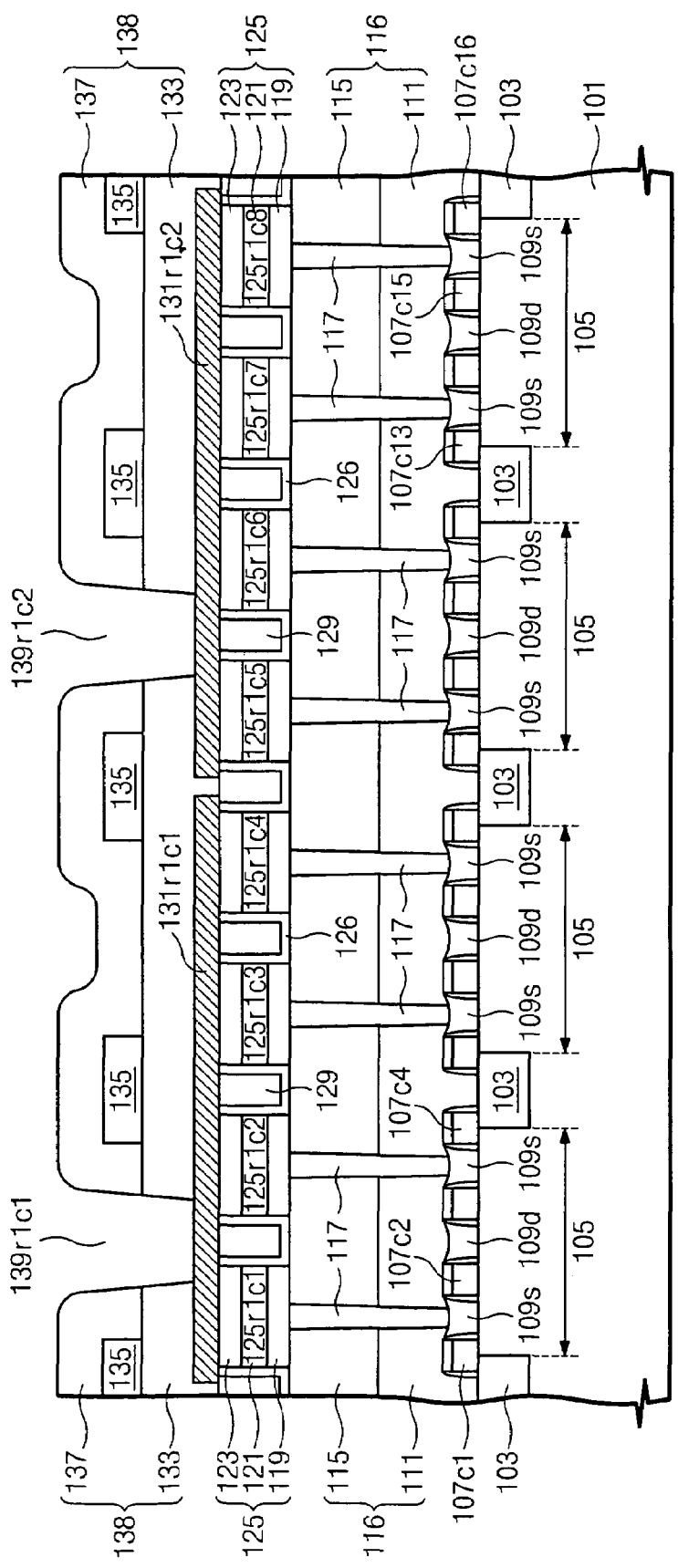

Next, referring to FIGS. 9A–B, an upper insulation layer 138 is formed on the entire surface of the semiconductor substrate including the local conductive patterns 131. The upper insulation layer 138 is formed by sequentially stacking a first upper interlayer dielectric layer 133 and a second upper interlayer dielectric layer 137. A plurality of parallel main word lines 135 can be formed on the first upper interlayer dielectric layer 137 before forming the second upper interlayer dielectric layer 137. That is, the main word lines can be formed of aluminum using sputtering method, atomic layer deposition. The main word lines 135 are parallel to the column direction. Generally, one of the main word line 135 controls four word lines through a decoder.

Via holes 139 (139$r$1$c$1, 139$r$1$c$2, 139$r$2$c$1, 139$r$2$c$2, 139$r$3$c$1, 139$r$3$c$2, 139$r$4$c$1 and 139$r$3$c$2), which expose each local conductive pattern 131 (131$r$1$c$1, 131$r$2$c$1, 131$r$2$c$2, 131$r$3$c$1, 131$r$3$c$2, 131$r$4$c$1 and 131$r$4$c$2), are formed by patterning the upper insulation layer 138. In this case, via holes 139$r$1$c$1, 139$r$1$c$2, 139$r$3$c$1 and 139$r$3$c$2, which expose conductive patterns 139$r$1$c$1, 139$r$1$c$2, 139$r$3$c$1 and 139$r$3$c$2 of odd numbered rows, expose a left part of each local conductive pattern. That is, the via holes 139$r$1$c$1, 139$r$1$c$2, 139$r$3$c$1 and 139$r$3$c$2 are formed on the 2×2 array of the left capacitors among the 4×2 array of the capacitors covered with each local conductive pattern. In contrast, via holes 139$r$2$c$1, 139$r$2$c$2, 139$r$4$c$1 and 139$r$4$c$2, expose even numbered conductive patterns 139$r$2$c$1, 139$r$2$c$2, 139$r$4$c$1 and 139$r$4$c$2, and expose the right part of each conductive pattern. In other words, via holes 139$r$2$c$1, 139$r$2$c$2, 139$r$4$c$1 and 139$r$4$c$2 are formed on the 2×2 array of right capacitors among the 4×2 array of capacitors covered with each local conductive pattern.

Next, as shown in FIG. 5A and FIG. 5B, plate lines 141 (141$c$1, 141$c$2, 141$c$3 and 141$c$4) that are orthogonal to the bit lines 113 (parallel to the main word lines) are formed by patterning a conductive material deposited on the via holes and the upper insulation layer 138. The plate lines 141 are in columns. Accordingly, the plate lines 141 are electrically connected through the via holes to the local conductive patterns 131. A couple of plate lines 141 pass on top of the local conductive pattern 131. In this case, the plate lines 141 in odd numbered columns are electrically connected to the local conductive patterns 131 of odd numbered rows and electrically isolated from the local conductive patterns 131 of even numbered rows. The plate lines of even numbered columns are electrically connected to the local conductive patterns 131 of even numbered rows and electrically isolated from the local conductive patterns 131 of odd numbered rows. As shown, a first column plate line 141$c$1 is electrically connected to the local conductive patterns 139$r$1$c$1 and 139$r$3$c$1 of odd numbered rows among the local conductive patterns 131 of the first column. A second column plate line 141$c$2 is electrically connected to the local conductive patterns 131$r$2$c$1 and 131$r$2$c$4 of even numbered rows among the local conductive patterns 131 of the first column.

As will be appreciated, the plate lines 141 in odd numbered columns may be electrically connected to the local conductive patterns 131 in even numbered rows and electrically isolated from the local conductive patterns 131 of odd numbered rows, and the plate lines 141 in even numbered columns may be electrically connected to the local conductive patterns 131 in odd numbered rows and electrically isolated from the local conductive patterns 131 of even numbered rows.

Several of the ferroelectric capacitors 125 among adjacent active regions are electrically connected to a common one of the local conductive patterns 131, and a plurality of the plate lines 141 are on top of the local conductive patterns 131. As such, the plate lines 141 may be alternately connected to groups of several of the ferroelectric capacitors 125, and which may not increase signal delay in the local conductive patterns 131. Accordingly, the number of plate lines 141 may be decreased in a memory cell array, and which may reduce the size of a plate line selection circuit and the dimensions of the chip.

Figure 10:
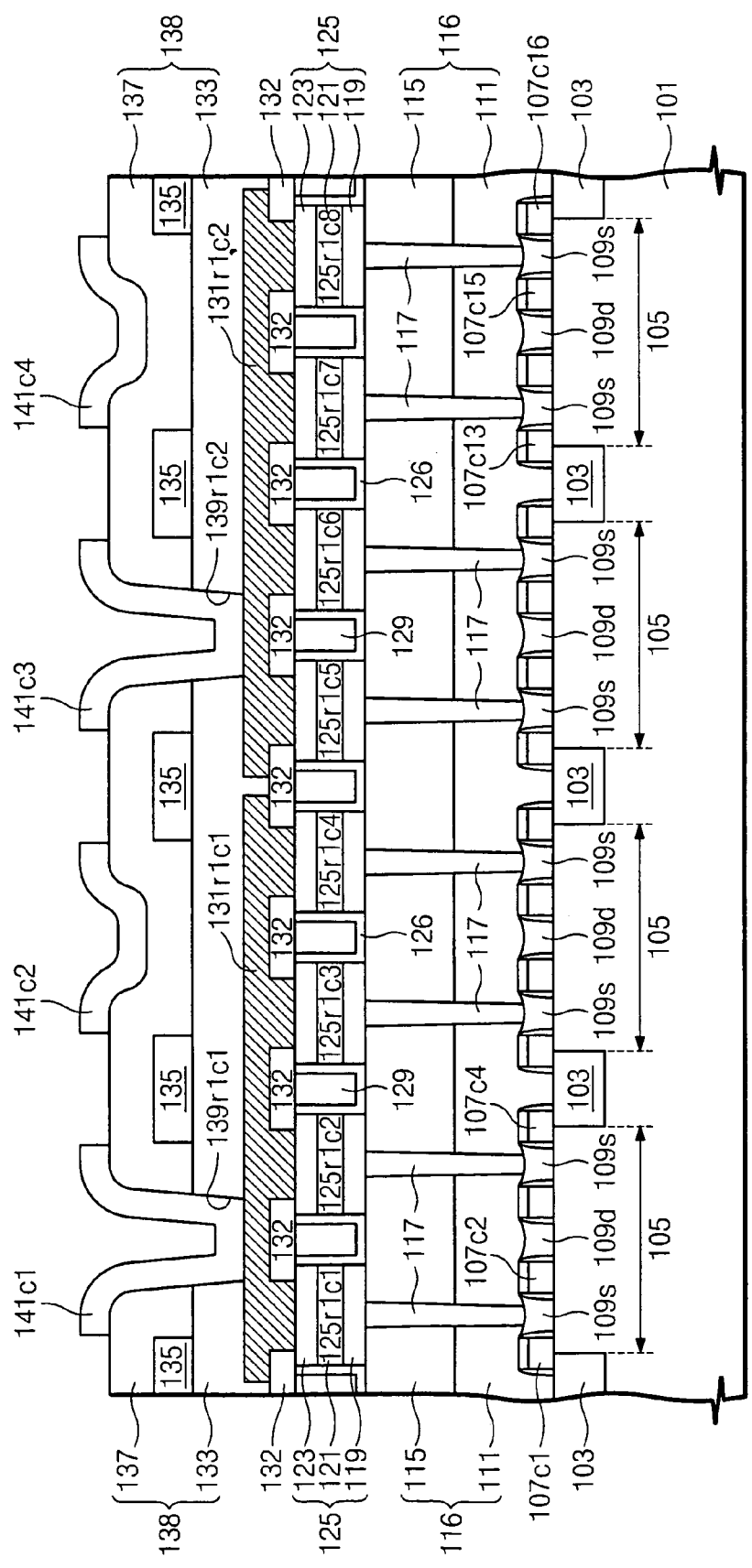
FIG. 10 is a cross-sectional view of the ferroelectric memory device shown in FIG. 5A, and is a cross-sectional view taken along A–A' of FIG. 5A, according to second embodiments of the present invention.

FIG. 10 is a cross-sectional view taken along lines A–A' in FIG. 5A according to some modified embodiments of the first embodiments of the present invention, and with reference to FIGS. 5B–C, FIG. 6A through FIG. 9A, and FIG. 6B through FIG. 9B. The local conductive patterns are electrically connected through contact holes penetrating an insulation layer 132 to upper electrodes of the ferroelectric capacitors. After forming the ferroelectric capacitors (see FIG. 7A and FIG. 7B), the insulation layer 132 is formed. Contact holes, which expose each upper electrode of the ferroelectric capacitor, are formed by patterning the insulation layer 132. A conductive material is deposited on the contact holes and the insulation layer 132. Then, the local conductive patterns are formed by patterning the conductive material. Additional processes may then be performed, such as those described above for the first embodiments of the present invention.

Figure 11A:
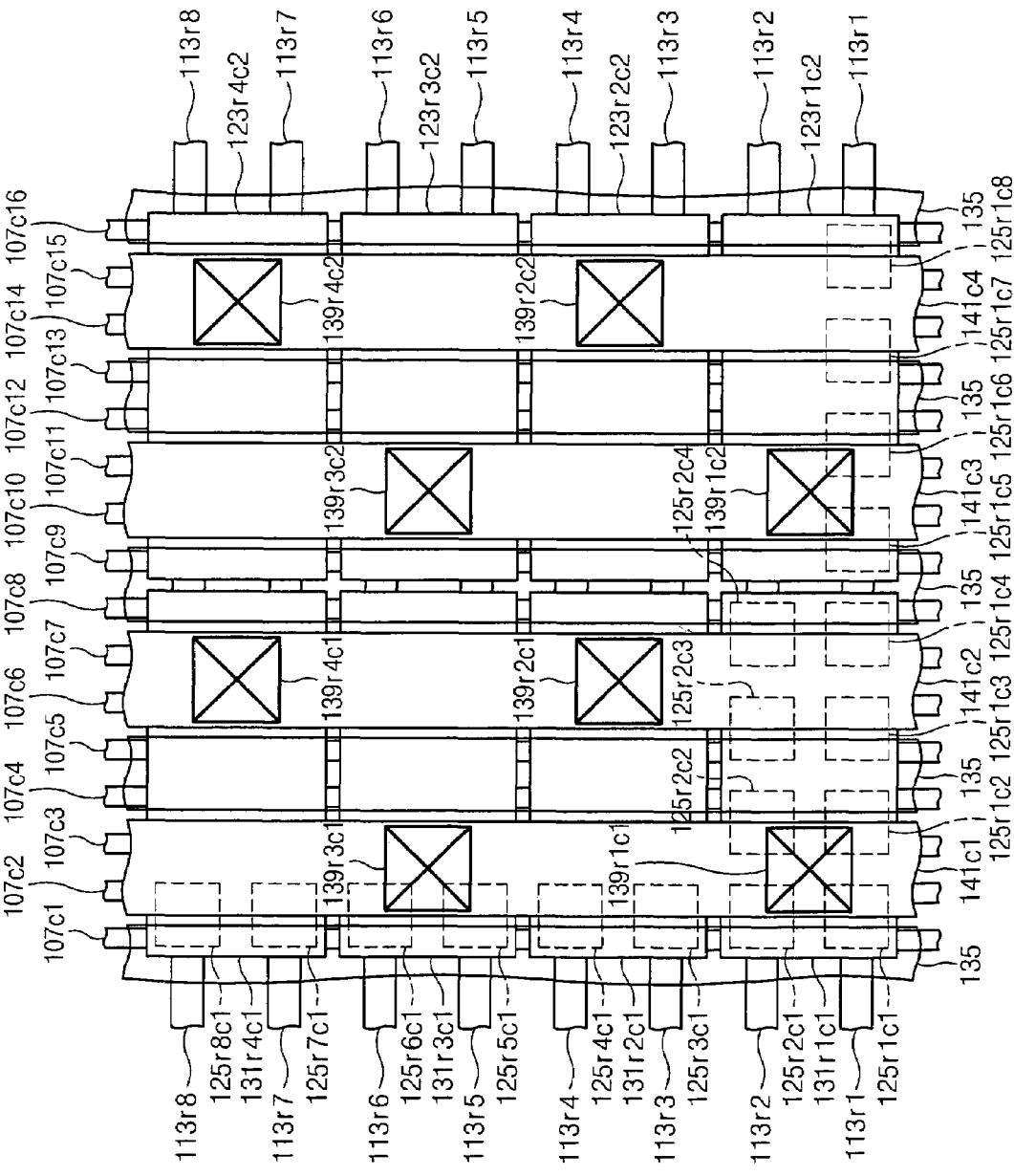
FIG. 11A is a plan view of the ferroelectric memory device shown in FIG. 5A.

FIG. 11A is a plan view of some other modified embodiments of the first embodiments of the present invention. FIG. 11B is a cross-sectional view taken along line A–A' in FIG. 11A.

In the second modified embodiments, the local conductive patterns are not formed. Upper electrodes of the ferroelectric capacitor take the place of the local conductive patterns. The upper electrode of the ferroelectric capacitors and the local conductive patterns of the first embodiment have the same shape and position. In addition, the upper electrode of the ferroelectric capacitors is electrically connected to the plate line directly. A 4×2 array of the ferroelectric capacitors arranged in row and column directions share one upper electrode (common upper electrode).

Figure 6B:
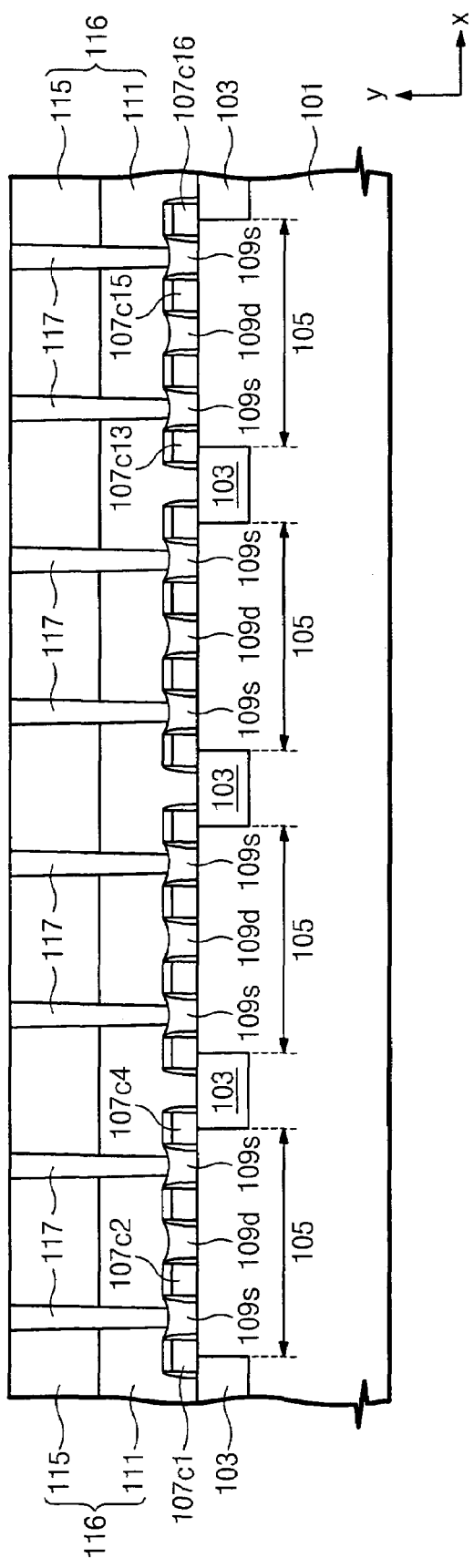

As shown in FIG. 6A and FIG. 6B, active regions 105, word lines 107, bit lines 113, contact pads 109a and 109b, a lower insulation layer 115 and contact plugs 117 are formed in the same method previously mentioned. Next, referring to FIG. 11A and FIG. 11B, bottom electrodes 119 connected to each contact plug 117 are formed. After forming contact plugs 117, a supporting insulation layer 129 is formed a trench, which expose the contact plugs 117, is formed by patterning the supporting insulation layer 129. Next, the trench is filled with an electrode material. As a result, the bottom electrode 119 is formed a ferroelectric layer 121 and an upper electrode layer are formed on an entire surface of the semiconductor substrate including the bottom electrode 119. Common upper electrodes 123r1c1, 1213r1c2, 123r2c1, 123r2c2, 123r3c1, 123r3c2, 123r4c1 and 123r4c2 corresponding to a local conductive pattern of the first embodiment are formed by patterning the upper electrode layer. The common upper electrode 123 is formed to cover a 4×2 array of the bottom electrodes in row and column directions. In this case, the ferroelectric layer 121 can be patterned simultaneously according to some embodiments. After forming the common upper electrodes 123, the upper insulation layer 138 is formed using, for example, the same process as was described for the first embodiment. The upper insulation layer 138 is formed by sequentially stacking a first upper interlayer dielectric layer 133 and a second upper interlayer dielectric layer 137. Before forming the second upper interlayer dielectric layer 137, a plurality of parallel main word lines 135 can be formed on the first upper interlayer dielectric layer 133. Via holes 139 (139r1c1, 139r1c2, 139r2c1, 139r2c2, 139r3c1, 139r3c2, 139r4c1 and 139r4 c2, which expose each of the common upper electrodes 123r1c1, 123r1c2, 123r2c2, 123r3c1, 123r3c2, 123r4c1 and 123r4c2, are formed by patterning the upper insulation layer 138. In this case, via holes 139r1c1, 139r1c2, 139r3c1 and 139r3c2 exposing the common upper electrodes of odd row 123r1c1, 123r1c2, 123r3c1 and 123r3c2 exposes left parts thereof. To the contrary, via holes 139r2c1, 139r2c2, 139r4c1 and 139r4c2 exposing the common upper electrodes of even row 123r2c1, 123r2c2, 123r4c1 and 123r4c2 expose the right parts thereof. Plate lines 141c1, 141c2, 141c3 and 141c4 are formed using for example the same process that was described with regard to the first embodiment.

Figure 12A:
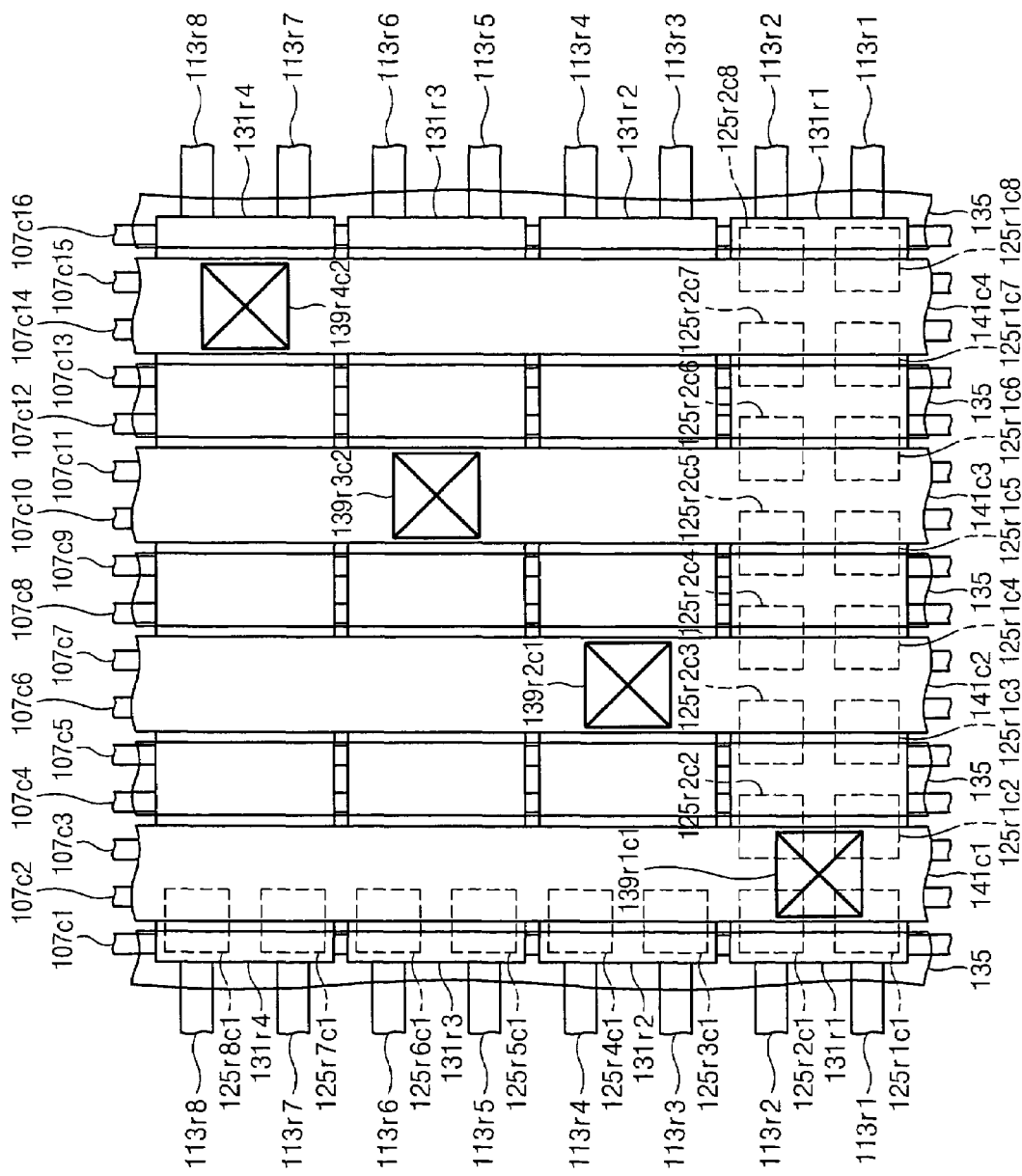
FIG. 12A is a schematic plan view of a part of the cell array region of the ferroelectric memory device having the folded bit line structure according to the second embodiments of the present invention.
Figure 12B:
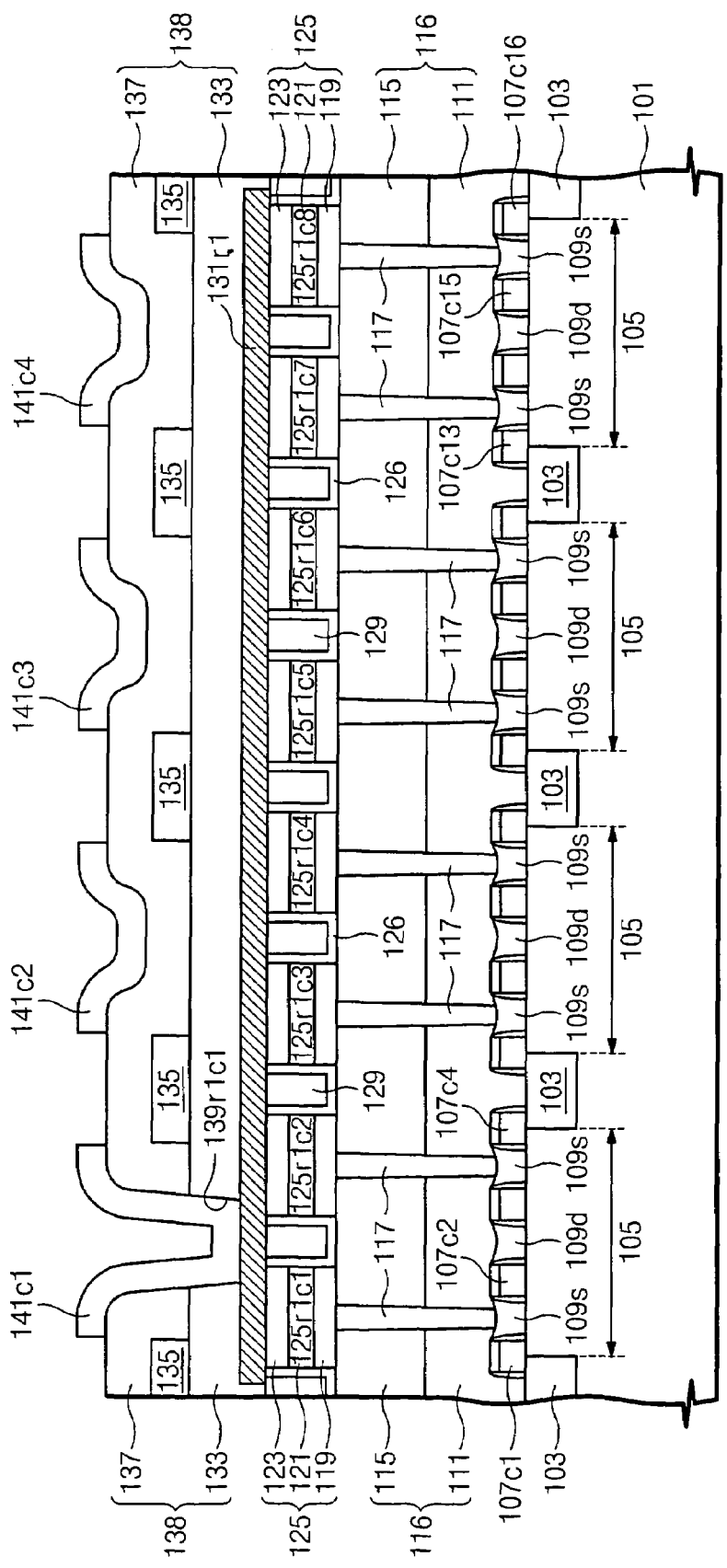
FIG. 12B is a cross-sectional view taken along A–A' of FIG. 12A.

FIG. 12A is schematically plan view of a part of cell array region of the ferroelectric memory device having a folded bit line structure. FIG. 12B is a cross-sectional view taken along line A–A' in FIG. 12A.

In contrast to the first embodiments, each local conductive pattern is electrically connected to an array of 8×2 ferroelectric capacitors arranged in two adjacent rows of 8 of the ferroelectric capacitors. In the first embodiments, two local conductive patterns that are adjacent in a row are connected. Accordingly, four plate lines pass on top of each of the local conductive patterns. In addition, the plate line 141c1 of the first column is electrically connected to the local conductive patterns of the first row, the fifth row, the ninth row, the thirteen row, . . . , the (4*(k−1)+1) row, wherein k is a natural number. The plate line 141c2 of the second column is electrically connected to the local conductive patterns of the second row, the sixth row, the tenth row, the fourteen row, . . . , the (4*(k−1)+2) row. In the same way, the plate line 141c3 of the third column is electrically connected to the local conductive patterns of the third row, the seventh row, the eleven row, the thirteen row, . . . , the (4*(k−1)+3) row. The plate line 141c4 of the fourth column is electrically connected to the local conductive patterns of the fourth row, the eighth row, the twelve row, the sixteen row, . . . , the (4*(k−1)+4) row. The fifth column plate line is connected to the local conductive patterns in the same way as the first column plate line. The sixth column plate line is connected to the local conductive patterns in the same way as the second column plate line. The seventh column plate line is connected to the local conductive patterns in the same way as the third column plate line. The eighth plate line is connected to the local conductive patterns in the same way as the fourth column plate line. In this manner, the plate lines are connected to the local conductive patterns.

Referring to FIGS. 12A–B, the local conductive pattern 131r1 covers and is electrically connected to sixteen ferroelectric capacitors 125r1c1, 125r1c2, . . . , 125r1c7, 125r1c8, 125r2c1, 125r2c2, . . . , 125r2c7 and 125r2c8 arranged two adjacent rows of 8 of the ferroelectric capacitors 125. In addition, four plate lines 141c1, 141c2, 141c2, 141c3 and 141c4 are on top of the local conductive pattern 131r1c1. The local conductive pattern 131r1c1 is electrically connected to the plate line 141r1c1 through a via hole 139r1c1. The via hole 139r1c1 is formed on top of the ferroelectric capacitors 125r1c1, 125r1c2, 125r2c1 and 125r2c2. Four plate lines 141c1, 141c2, 141c2, 141c3 and 141c4 are on top of the local conductive pattern 131r2. The local conductive pattern 131r2 is electrically connected to the plate line 141c2 through a via hole 139r2c1.

In second embodiments of the present invention, the number of ferroelectric capacitor connected to each plate line is the same as the first embodiments of the present invention. However, the number of ferroelectric capacitors that are activated during cell operation is half as many as are activated according to the previously described first embodiments of the present invention.

As will be appreciated, the second embodiments of the present invention can be modified in the manner that was described with regard to the first embodiments of the present invention. Based on the first and second embodiments, the local conductive pattern can be extended in row direction. That is, the local conductive pattern can be formed to electrically connect to $2^n*2$ (n is natural number) of the ferroelectric capacitors, where $2^n$ of the ferroelectric capacitors of the $2^n*2$ (n is natural number) ferroelectric capacitors are arranged along a row, and two ferroelectric capacitors of the $2^n*2$ (n is natural number) ferroelectric capacitors are arranged along columns.

Now, a ferroelectric memory device having shared bit line structure will be described hereinafter.

Figure 13A:
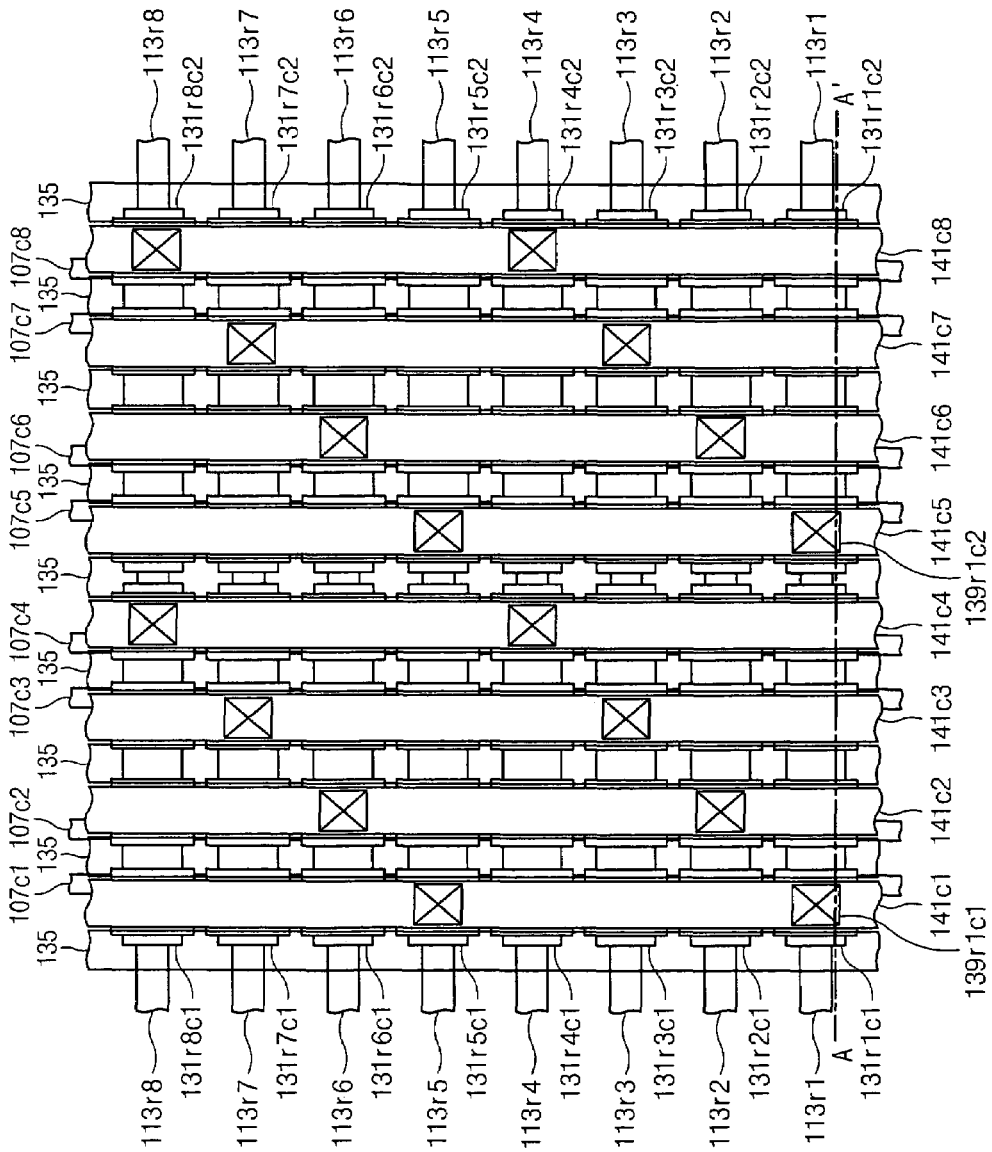
FIG. 13A is a plan view of a part of the cell array region of a ferroelectric device having a shared bit line structure according to third embodiments of the present invention.
Figure 13B:
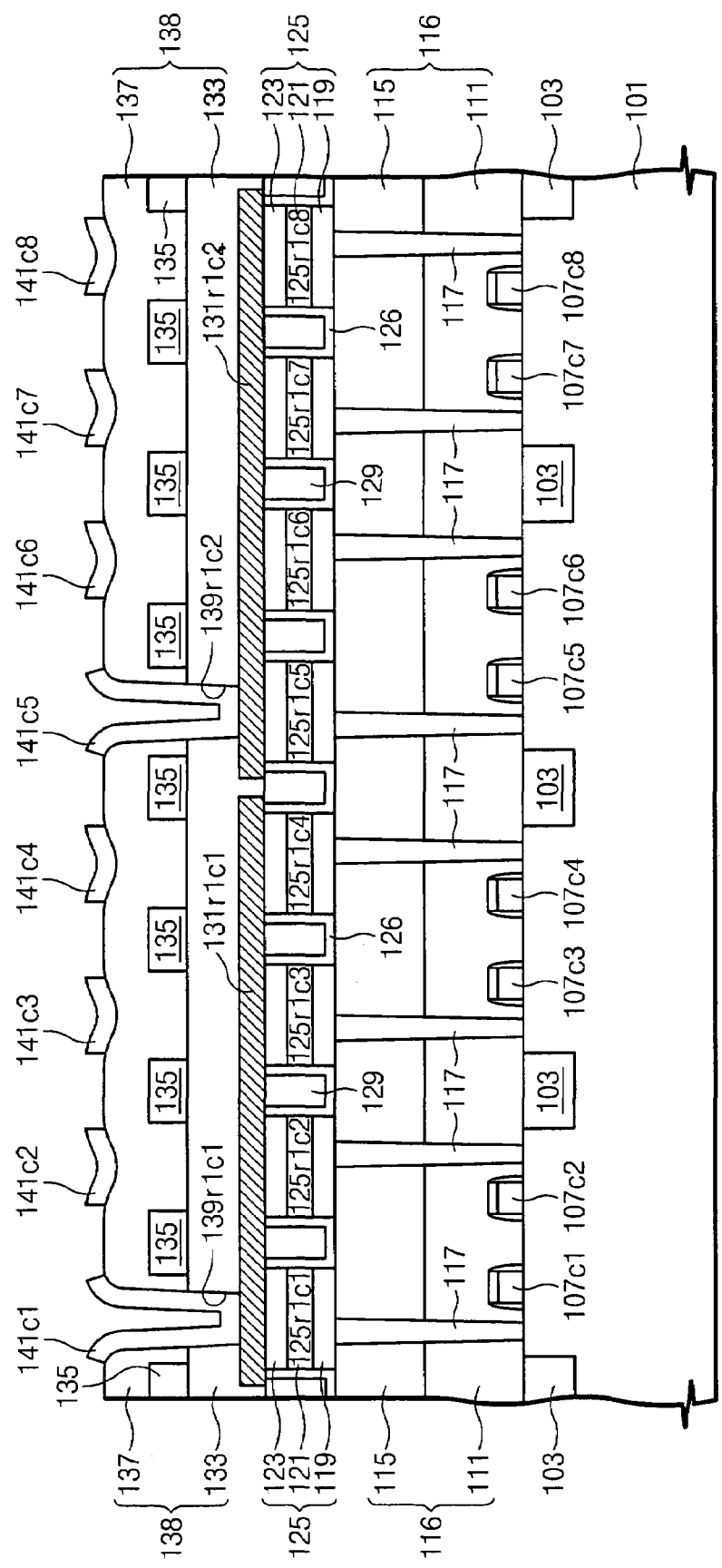
FIG. 13B is a cross-sectional view taken along A–A' of FIG. 13A.

FIG. 13A is a plan view of a part of cell array of the ferroelectric memory device having shared bit line structure according to the third embodiment. FIG. 13B is a cross-sectional view taken along A–A' in FIG. 13A.

Referring to FIGS. 13A–B, an isolation layer 103 is formed on a semiconductor substrate 101. The isolation layer 103 defines a plurality of active regions 105 arranged in two-dimensions (row and column directions). The size of the active regions in the row direction may be larger than the size of active region in the column direction. An insulated gate electrode, that is, word lines 107 are arranged in row direction (x direction). The insulated gate electrode is extended in the column direction to cross over the active regions 105 and an isolation region 103. Eight word lines 107c1, 107c2, 107c3, . . . , 107c6, 107c7 and 107c8 are shown in FIG. 13A and FIG. 13B. Each of the active regions 105 cross a couple of the gate electrodes. Therefore, each active region 105 can form three parts. A common drain region can be formed on the active region between a couple of the gate electrodes, and source regions can be formed on the active regions outside of the common drain region. Accordingly, cell transistors are formed at points where the gate electrodes 107 cross the active regions.

An entire surface of the semiconductor substrate including the cell transistors is covered with a lower insulation layer 116. The lower insulation layer 116 can be dual layer of a first lower interlayer dielectric layer 111 and a second lower interlayer dielectric layer 115 that are sequentially stacked. A plurality of bit lines 113, which are orthogonal to the word lines 107 are formed on the lower insulation layer 107, that is, the first lower interlayer dielectric layer. Eight bit lines 113r1, 113r2, . . . , 113r7 and 113r8 are shown in FIG. 13A and FIG. 13B. Each of the bit lines 113 is electrically connected to the drain region through a bit line contact hole that penetrates the first bottom interlayer dielectric layer 111. Contact plugs 117 are disposed in the lower insulation layer 116. Contact plugs 117 penetrate the lower insulation layer and are electrically connected to the source regions.

A plurality of the ferroelectric capacitors 125 are arranged along rows (x-axis) and columns (y-axis) in a two-dimension array on the surface of the semiconductor substrate, including contact plugs 117. Sixty four ferroelectric capacitors 125r1c1, 125r1c2, . . . , 125r1c7, 128r1c8, 125r2c1, 125r2 c2, . . . , 125r2c7, 125r2c8 . . . , . . . , 125r8c1, 125r8c2, . . . , 125r8c7 and 125r8c8 are shown in FIG. 13. Referring to FIG. 13B, eight ferroelectric capacitors 125r1c1, 125r1c2, . . . , 125r1c7, 125r1c8 are arranged in a first row. Two ferroelectric capacitors along the row direction are electrically connected to two source regions of each active region 105.

Each of the ferroelectric capacitors 125 can include a bottom electrode 119, a ferroelectric layer pattern 121 and an upper electrode 123 are stacked sequentially. The bottom electrodes 119 are disposed on the contact plugs 117 respectively and are electrically connected to the contact plugs 117. Consequently, the bottom electrode 119 is electrically connected through the contact plug 117 to the source region. Empty space between the ferroelectric capacitors 125 can be filled with a supporting insulation layer 129.

Furthermore, a hydrogen barrier layer 126 may be interposed between the supporting insulation layer 129 and a sidewall of the ferroelectric capacitors 125.

A plurality of local conductive patterns 131 are arranged in row and column directions on the ferroelectric capacitors 125 and the supporting insulation pattern 129. Referring to FIG. 13A, sixteen local conductive patterns 131r1c1, 131r1c2, 131r2c1, 131r2c2, 131r3c1, 131r3c2, 131r4c1, 131r4c2, 131r5 c1, 131r5c2, 131r6c1, 131r6c2, 131r7c1, 131r7c2, 131r8c1 and 131r8c2 in a 2×8 array (2 along the row direction and 8 along the column direction) are arranged to form an 8×8 array of the ferroelectric capacitors 125. Each of the local conductive patterns 131 overlaps and is electrically connected to four of the ferroelectric capacitors 125 along the row direction. The local conductive pattern 131r1c1 is electrically connected to four ferroelectric capacitors 125r1c1, 125r1c2, 125r1c3 and 125r1c4. Four ferroelectric capacitors 125r1c1, 125r1c2, 125r1c3 and 125r1c4 are arranged in a first row from the bottom. In this case, two of the ferroelectric capacitors 125r1c1 and 125r1c2 among the four ferroelectric capacitors ferroelectric capacitors of the first row are associated with the same active region, and the other two ferroelectric capacitors 125r1c3 and 125r1c4 among of the first row are associated with another active region.

Each local conductive pattern 125 is formed of a metal layer, a conductive metal oxide layer and a conductive metal nitride layer or a combination layer of the metal layer, the conductive metal oxide layer and the conductive metal nitride layer. For example, the local conductive patterns 125 may be formed of Titanium aluminum nitride layer (TiAlN), Titanium layer (Ti), Titanium nitride (TiN), Iridium layer (Ir), Iridium oxide layer (IrO), Platinum layer (Pt), Ruthenium layer (Ru), Ruthenium oxide layer ($RuO_2$) and Aluminum layer (Al) or a combination thereof.

As shown in FIG. 13B, each local conductive pattern 125 directly contacts, and is electrically connected to, the upper electrodes of the ferroelectric capacitors 125.

An entire surface of the semiconductor substrate including the local conductive pattern 125 is covered with an upper insulation layer 138. The upper insulation layer 138 may be dual layer of a first upper interlayer dielectric layer 138 and a second upper insulation layer 137 that are sequentially stacked.

A plurality of main word lines 135 can be disposed between the first interlayer dielectric layer 133 and the second interlayer dielectric layer 137. The main word lines 135 are in columns (y axis) and are parallel to the word line 107. The main word lines 135 controls four word lines 107 through a decoder respectively.

Plate lines 141c1–141c4 are arranged on the upper insulation layer 138 between the main word lines 135. The plate lines 141c1–141c4 are orthogonal to the bit lines 113 and parallel to the word lines 107. Four of the plate lines 141 are orthogonal to each of the local conductive patterns 131. In this case, the plate lines in the $2^{k+1}*(n-1)+i$ numbered column is electrically connected to the conductive patterns 131 in the $2^{k+1}*(n-1)+i$ numbered row of the same column $2^{k+1}*(n-1)+i$, where n is natural number and i in a range from 1 to $2^{k+1}$. As shown, the plate line 141r1 of the first row is connected to the local conductive patterns of the first row and fifth row of the first column. In the same way, the plate line 141r5 of the fifth column is connected to the conductive patterns 125r1c5 and 125r5c5 of the first row and the fifth row of the fifth column.

According to the third embodiments of the present invention, the number of activated ferroelectric capacitors connected to the plate line can be reduced to a quarter as many as compared with the previously described conventional shared bit line structure. Consequently, the third embodiments of the present invention may allow four times more ferroelectric capacitors to be connected to plate line compared to the described conventional shared bit line structure with the same resulting signal delay.

A method for fabricating the ferroelectric memory device is described with reference to FIGS. 13A–B and FIG. 14.

Figure 14:
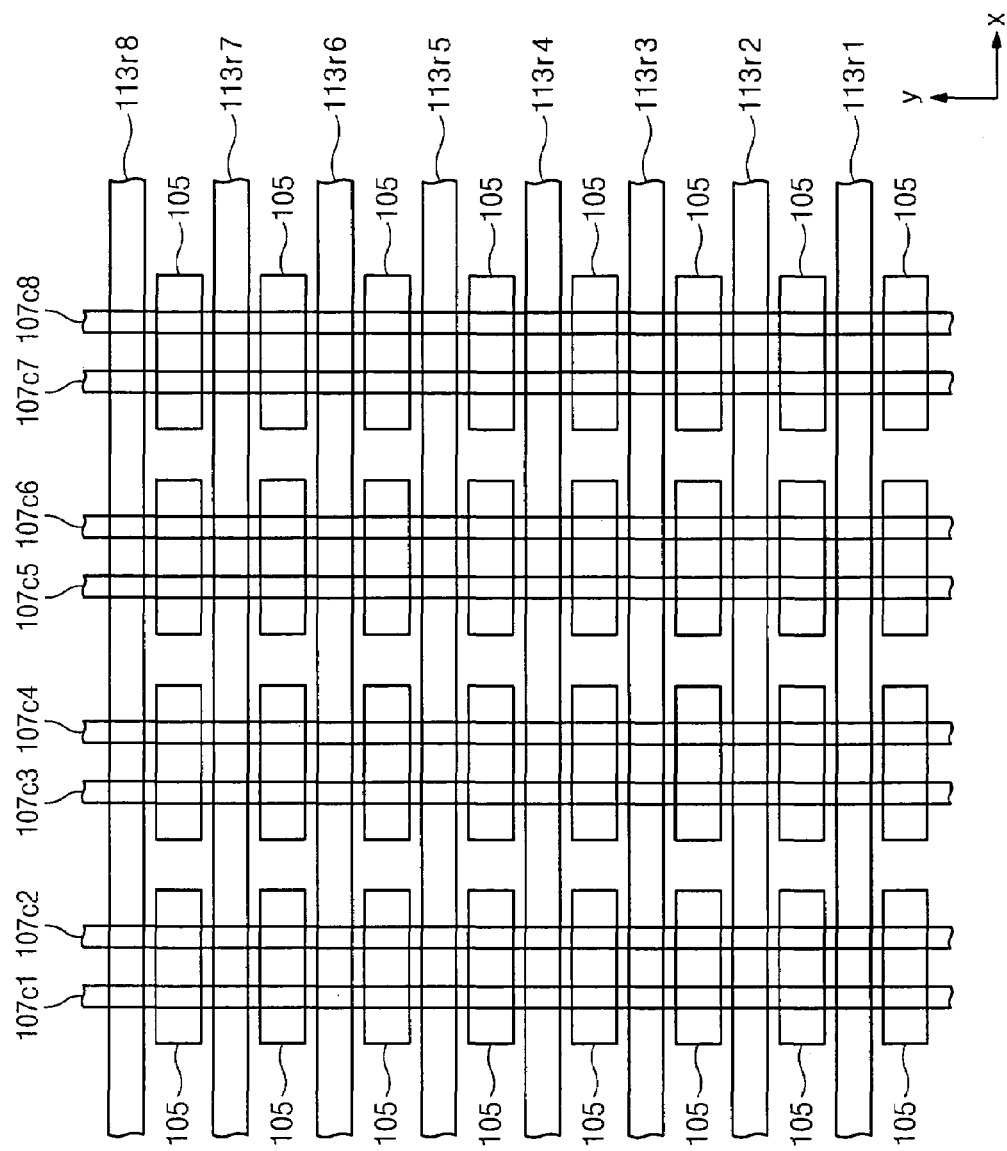
FIG. 14 is a plan view of the structure of a word line and a bit line according to the third embodiments of the present invention.

FIG. 14 is a plan view of a resultant structure of a word line and a bit line formed on a semiconductor substrate by process described above according to the third embodiments of the present invention. Referring to FIGS. 13A, 13B and 14, a plurality of active regions 105 are defined by forming an isolation layer 103 on a predetermined region of the semiconductor substrate 101. The active regions 105 are arranged in row and column directions. A gate insulation layer, a gate conductive layer and a capping insulation layer are sequentially formed on an entire surface of the semiconductor substrate. A plurality of parallel gate patterns, which cross top of the active regions 105 and the isolation layer 103, are formed by patterning the gate conductive layer and the gate insulation layer successively. Each of the gate patterns comprises a gate insulation pattern, a gate electrode and a capping insulation pattern. The gate insulation pattern, the gate electrode and the capping insulation pattern are sequentially stacked. In this case, each of the active regions crosses a couple of gate electrodes 107. The gate electrode 107 serves as a word line. The word line extends in column direction and is arranged in row direction (107c1, 107c2, . . . , 107c7 and 107c8).

Impurity ions are implanted into the active regions 105 using the gate patterns and the isolation region 103 as an ion implantation mask. As a result, three impurity regions are formed on each active region. A center impurity region among the three impurity regions is equivalent to a common drain region, the other two of the impurity regions are equivalent to source regions. Accordingly, a couple of cell transistors are formed on each active region. Consequently, the cell transistors are arranged along row and column directions on the semiconductor substrate in two-dimensions. A spacer is formed on lateral surfaces of the gate pattern.

A first lower interlayer dielectric layer 111 is formed on an entire surface of the semiconductor substrate. Bit line contact holes are formed to expose the drain regions by patterning the first lower interlayer dielectric layer 111. The bit line contact holes and the first lower interlayer dielectric layer 115 are deposited with a conductive material and patterned to form bit lines 113 (113r1, 113r2, . . . , 113r7 and 113r8) that are orthogonal to the word lines 107.

Next, a second lower interlayer dielectric layer 115 is formed on an entire surface of the semiconductor substrate including the bit lines 113. The first and second lower interlayer dielectric layers 111 and 115 are composed of a lower insulation layer 116. Contact holes, which expose the source regions, are formed by patterning the lower insulation layer 116. Then, the contact holes are filled with a conductive material. As a result, contact plugs 117 are formed.

Next, a bottom electrode layer, a ferroelectric layer and an upper electrode layer are sequentially formed on the contact plugs 117 and the bottom insulation layer 1163. A plurality of the ferroelectric capacitors 125, which are arranged along row and column directions in two-dimensions, are formed by patterning the bottom electrode layer, the ferroelectric layer and the upper electrode layer successively. Each of the ferroelectric capacitors 125 can include a bottom electrode 119, a ferroelectric layer pattern 121 and an upper electrode 123. The bottom electrode 119, the ferroelectric pattern 121 and the upper electrode 123 are successively stacked. Each of the bottom electrodes 119 are in contact with the contact plugs 117. A supporting insulation layer 129 is formed on an entire surface of resultant structure and the ferroelectric capacitors 124. A hydrogen barrier layer 126 can be formed conformally before the insulation layer 129 is formed.

Next, the upper electrodes are exposed by planarizing the supporting insulation layer 129 and the hydrogen barrier layer 126. Accordingly, the hydrogen barrier pattern 126 and the supporting insulation layer 129 remain between the ferroelectric capacitors 125.

Next, a conductive material is formed on the upper electrodes of the ferroelectric capacitors and the supporting insulation layer 129 and patterned to form local conductive patterns 131(131r1c1, 131r1c2, 131r2c1, 131r2c2, 131r3c1, 131 r3c2, 131r4c1, 131r4c2, 131r5c1, 131r5c2, 131r6c1, 131r6c2, 131r7 c1, 131r7c2, 131r8c1 and 131r8c2) electrically connected to each of several upper electrodes. Each of the local conductive patterns is in contact with and electrically connected to four capacitor upper electrodes arranged along the row direction. The local conductive pattern is arranged in row and column directions.

An upper insulation layer 138 is formed on an entire surface of the semiconductor substrate including the local conductive patterns. The upper insulation layer 138 is formed by stacking a first upper interlayer dielectric layer 133 and a second upper interlayer dielectric layer 137 sequentially. Before forming the second upper interlayer dielectric layer, a plurality of parallel main word lines 135 can be formed on the first upper interlayer dielectric layer 137.

Via holes 139 (139r1c1, 139r2c2, 139r3c3, 139r4c4, 139r5c5, 139r6c6, 139r7c7 and 139r8c8), which expose each of the local conductive patterns 131r1c1, 131r2c1, 131r2c2, 131r3c1, 131r3c2, 131r4c1, 131r4c2, 131r5 c1, 131r5c2, 131r6c1, 131r6c2, 131r7c1, 131r7c2, 131r8c1 and 131r8c2), are formed by patterning the upper insulation layer 138.

As shown in FIG. 13A, a conductive material is deposited on the via holes and the upper insulation layer 138 and patterned to form plate lines 141 (141c1, 141c2, 141c3, 141c4, 141c5, 141c6, 141c7 and 141c8) to be orthogonal to the bit line 113 (parallel to the main word lines). Each of the plate lines are in a row and extend in columns. Accordingly, the plate lines are electrically connected through the via hole to the bottom local conductive patterns. Four of the plate lines 141 are on the local conductive patterns 131. In this case, the plate line 141 in the $2^{k+1}*(n-1)+i$ numbered column is electrically connected to the conductive pattern 131 in the $2^{k+1}*(n-1)+i$ numbered row of the $2^{k+1}*(n-1)+i$ numbered column, where n is natural number and i is in a range from 1 to $2^{k+1}$ with respect to each k. That is, the plate line 141r1 of the first row is connected to the local conductive patterns of the first row and fifth row of the first column. In the same way, the plate line 141r5 of the fifth column is connected to the conductive patterns 125r1c5 and 125r5c5 of the first row and the fifth row of the fifth column.

Figure 15:
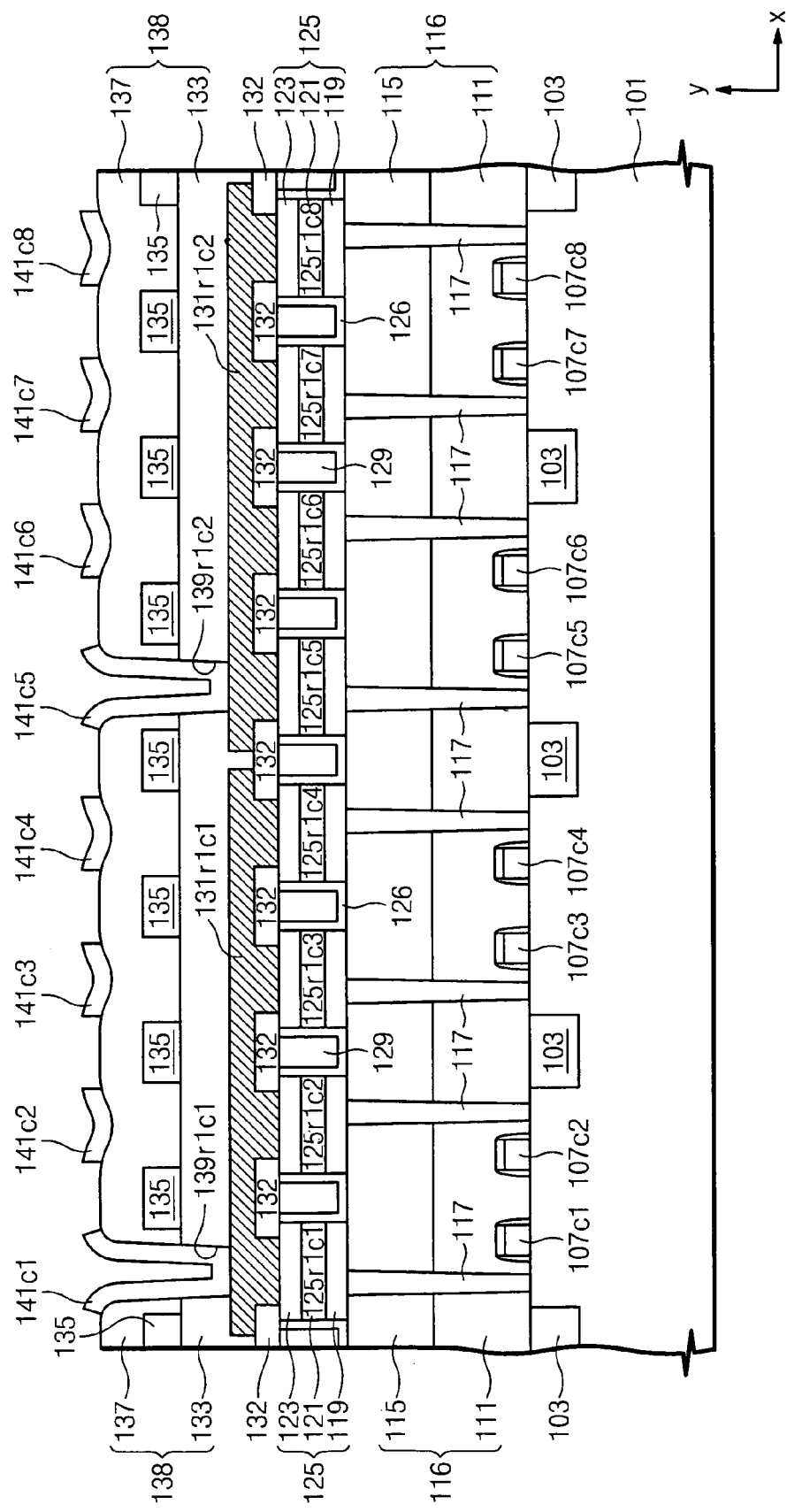
FIG. 15 is a cross-sectional view of the ferroelectric memory device shown in FIG. 13A and FIG. 13B and a cross-sectional view taken along A–A' in FIG. 13.

FIG. 15 is the first modification embodiment of the third embodiment mentioned above and can correspond to the first modification of the first embodiment. Referring to FIG. 15, the local conductive pattern is connected through the contact holes to the upper electrodes. The contact holes the insulation layer 132 expose each of the upper electrodes. Similar to the methods explained above with reference to FIGS. 13A, 13B and 14, the insulation layer 132 is formed after forming the ferroelectric capacitors. The contact holes, which expose the upper electrodes of each ferroelectric capacitors 125, are formed by patterning the insulation layer 132. Continuously, the contact holes and the insulation layer 132 are deposited with a conductive material and patterned to form the local conductive patterns.

Figure 16A:
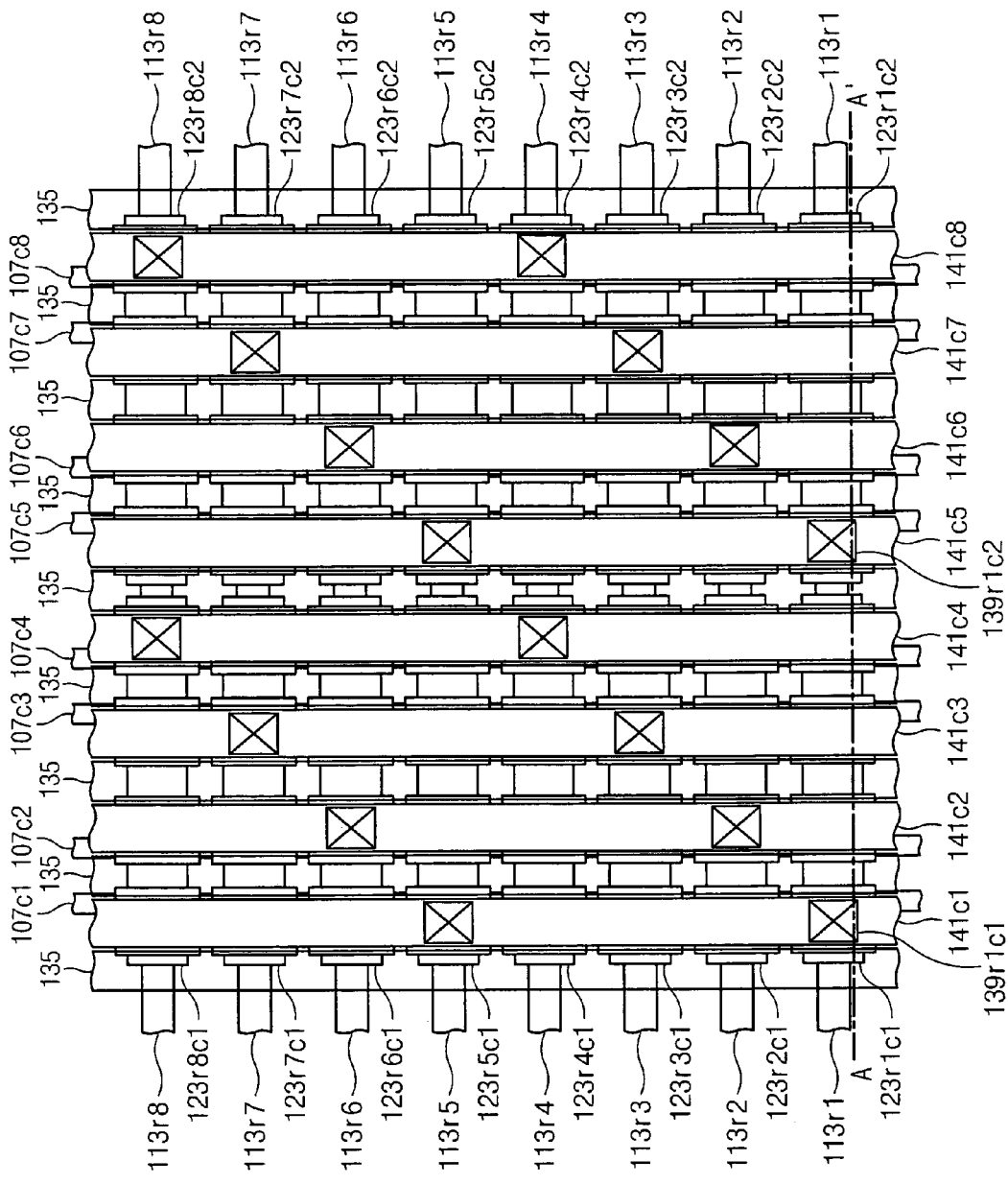
FIG. 16A is a plan view of the ferroelectric memory device shown in FIG. 13A and FIG. 13B.
Figure 16B:
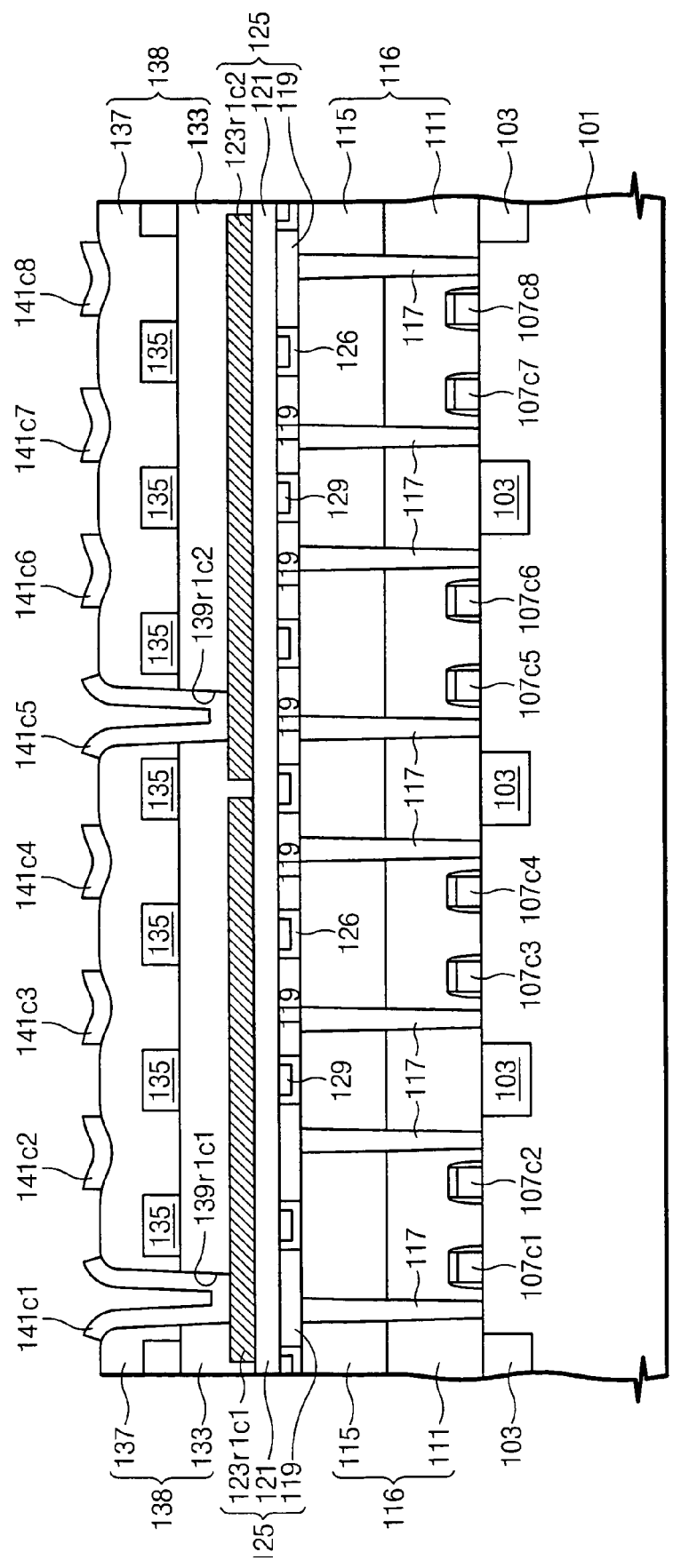
FIG. 16B is a cross-sectional view taken along A–A' in FIG. 16B.

FIG. 16a is the second modification embodiment of the third embodiment and can correspond to the second modification embodiment of the first embodiment. FIG. 16B is a cross-sectional view taken along line A–A' in FIG. 16A. Referring to FIG. 16A and FIG. 16B, like the second modification of the first embodiment, four adjacent ferroelectric capacitors in a row direction share one upper electrode (common upper electrode 123) commonly. The plate line is electrically connected to the common upper electrode 123.

Similar to the processes described above with reference to FIGS. 13A, 13B and 14, the active regions 105, the word lines 107, the bit lines 113, the contact pads 109a and 109b, the lower insulation layer 115 and he contact plugs 117 are formed. Next, referring to FIGS. 16A–B, the bottom electrodes 119 are formed to connect to each of the contact plugs 117. The supporting insulation layer 129 is formed after the contact plugs 117. The trench exposing the contact plugs 117 is formed by patterning the supporting insulation layer 129. The trench is filled with an electrode material. As a result, the bottom electrode 119 is formed. The ferroelectric layer 121 and the upper electrode layer are formed on the entire surface of the semiconductor substrate including the bottom electrode 119. Common upper electrodes 123r1c1, 123r1c2, 123r2c1, 123r2c2, 123r3c1, 123r3c2, 123r4c1, 123r4c2, 123r5 c1, 123r5c2, 123r6c1, 123r6c2, 123r7c1, 123r7c2, 123r8c1 and 123r8c2 corresponding to the local conductive pattern of the third embodiment are formed by patterning the upper electrode layer. The common upper electrodes 123 are formed in order to cover four bottom electrodes arranged in row direction. In this case, the ferroelectric layer may be patterned simultaneously. After forming the common upper electrodes 123, the upper insulation layer 138 is formed. The upper insulation layer 138 is formed by stacking the first and second upper interlayer dielectric layers 133 and 137 sequentially. Before forming the second upper interlayer dielectric layer 137, a plurality of parallel main word lines 135 can be formed on the first upper interlayer dielectric layer 137. The via holes exposing the common upper electrodes 123r1c1, 123r1c2, 123r2c1, 123r2c2, 123r3c1, 123r3c2, 123r4c1 and 123r4 c2 are formed by patterning the upper insulation layer 138. The plate lines 141c1, 141c2, 141c3, 141c4, 141c5, 141c6, 141c7 and 141c8 electrically connected to the common upper electrodes in a subsequent process.

Figure 17A:
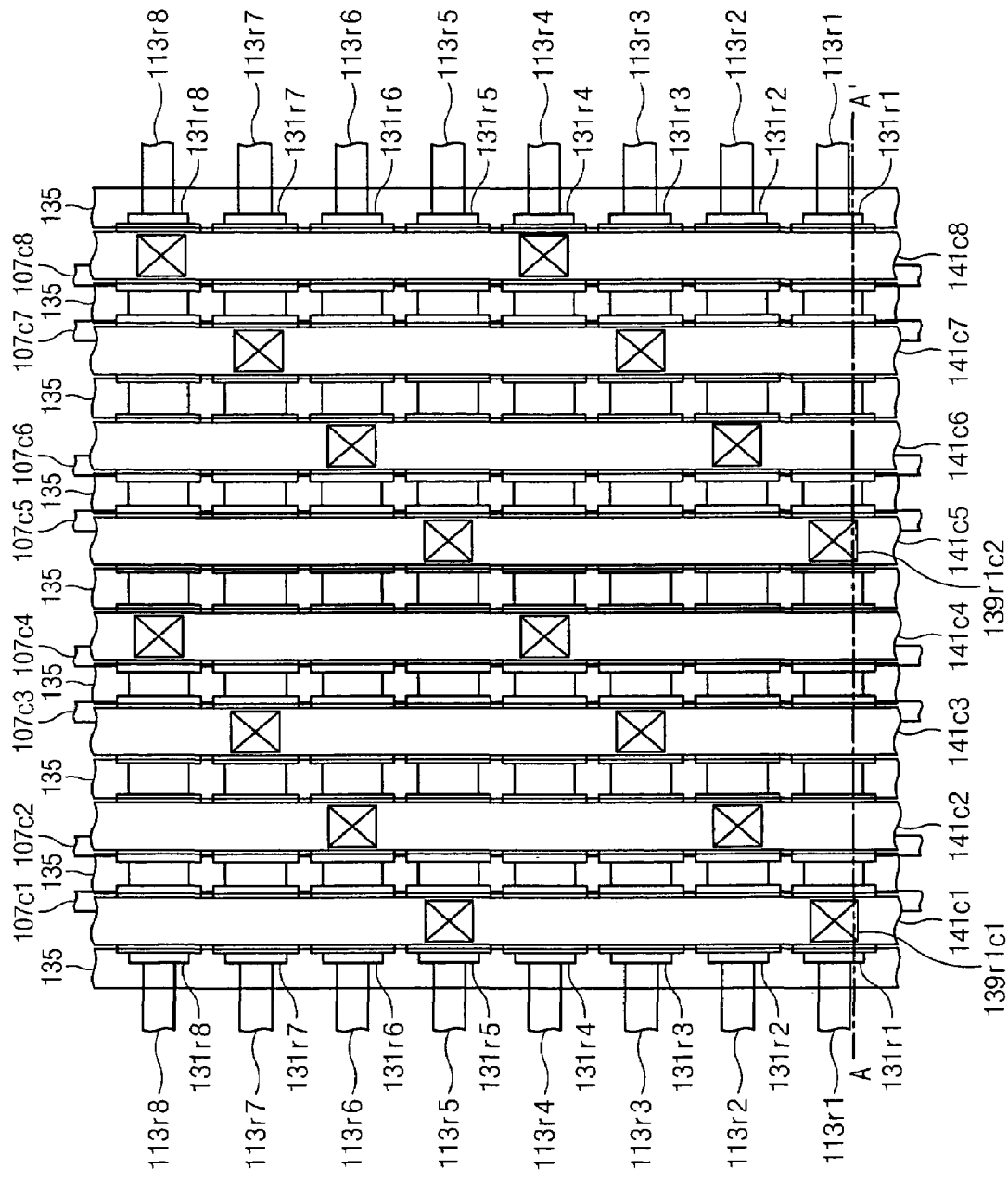
FIG. 17A is a plan view of a part of the cell array region of the ferroelectric memory device having a shared bit line structure according to fourth embodiments of the present invention.
Figure 17B:
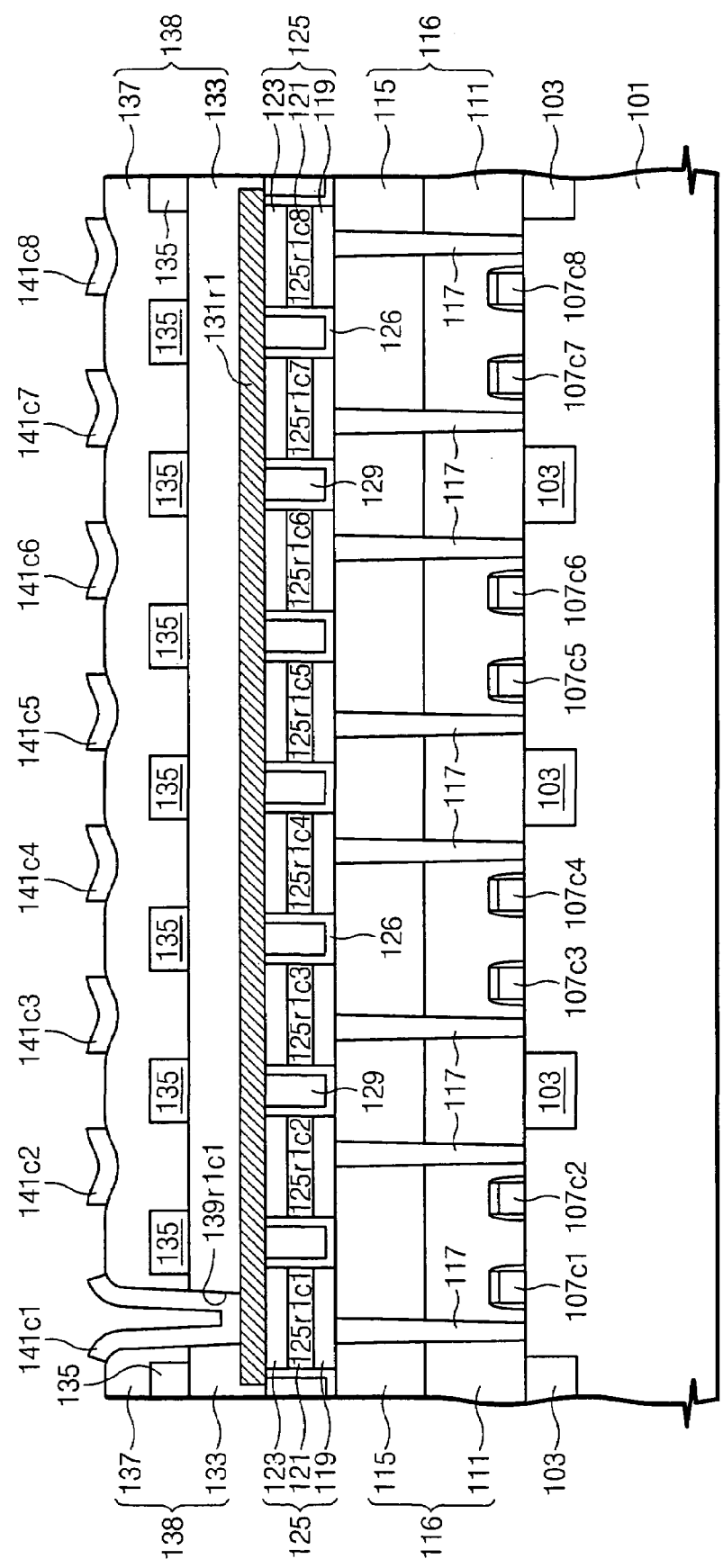
FIG. 17b is a cross-sectional view taken along A–A' of FIG. 15A.

FIG. 17A is schematically plan view of a part of a cell array region of a ferroelectric memory device having sharing bit line structure according to fourth embodiments of the present invention. FIG. 17B is a cross-sectional view taken along line A–A' in FIG. 15A.

In contrast to the third embodiments of the present invention, the local conductive patterns are electrically connected to eight ferroelectric capacitors arranged along the row direction. In this embodiment, two local conductive patterns that are adjacent in a row direction in the third embodiment are connected. Accordingly, eight plate lines pass top of each local conductive pattern. The plate lines of the 8*(n−1)+i numbered column is electrically connected to the conductive pattern of the same row of the same column, that is, the 8*(n−1)+i numbered row, where n is natural number and i is in the range from 1 to 8.

In the fourth embodiment of the present invention, the number of the ferroelectric capacitor connected to one plate line may be the same as the third embodiment. However, the number of the activated ferroelectric capacitors connected to the plate line during operating cell is reduced to half the number of activated ferroelectric capacitors compared to the third embodiment.

As will be appreciated the described modifications of the first embodiment of the present invention can be applied to the second embodiment embodiments of the present invention.

Based on the third and fourth embodiments of the present invention, the local conductive patterns can be extended in a row direction. For example, the local conductive pattern can be formed to electrically connect to $2^{n+1}$ (n is natural number) of the ferroelectric capacitors. In this case, the plate lines in the $2^{k+1}$*(n−1)+i columns is electrically connected to the conductive pattern in the $2^{k+1}$*(n−1)+i rows of the $2^{k+1}$*(n−1)+i columns, where n is natural number and i is increased from 1 to $2^{k+1}$.

Accordingly, the number of ferroelectric capacitors that are connected to one plate line may be increased without increasing the signal delay associated therewith, and/or the result chip size may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A ferroelectric memory device comprising:
   a semiconductor substrate;
   a plurality of ferroelectric capacitors, each comprising a bottom electrode, a ferroelectric layer, and an upper electrode layer, wherein the ferroelectric capacitors are arranged in rows and columns on the semiconductor substrate; and
   a plurality of columns of plate lines, wherein each of the plate lines is electrically connected to a plurality of the ferroelectric capacitors in a row, wherein
   at least two adjacent rows of four adjacent ferroelectric capacitors have a common upper electrode, and at least two of the plate lines are on the common upper electrode.

2. A ferroelectric memory device comprising:
   a semiconductor substrate;
   a plurality of ferroelectric capacitors, each comprising a bottom electrode, a ferroelectric layer, and an upper electrode layer, wherein the ferroelectric capacitors are arranged in rows and columns on the semiconductor substrate;

a plurality of columns of plate lines, wherein each of the plate lines is electrically connected to a plurality of the ferroelectric capacitors in a row; and a plurality of conductive patterns, each on, and electrically connected to, at least four adjacent ferroelectric capacitors in a row, wherein the plate lines are on, and electrically connected to, the conductive patterns opposite to the ferroelectric capacitors, wherein:

each of the conductive patterns are electrically connected to at least two adjacent rows of four adjacent ferroelectric capacitors;

the conductive patterns are arranged in rows and columns; and the plate lines extend along the columns, and each of the plate lines is electrically connected to at least two of the conductive patterns that are on opposite sides of an adjacent conductive pattern that is electrically isolated from the plate line.

3. A ferroelectric memory device comprising:

a semiconductor substrate;

a plurality of ferroelectric capacitors, each comprising a bottom electrode, a ferroelectric layer, and an upper electrode layer, wherein the ferroelectric capacitors are arranged in rows and columns on the semiconductor substrate;

a plurality of columns of plate lines, wherein each of the plate lines is electrically connected to a plurality of the ferroelectric capacitors in a row; and a plurality of conductive patterns, each on, and electrically connected to, at least four adjacent ferroelectric capacitors in a row, wherein the plate lines are on, and electrically connected to, the conductive patterns opposite to the ferroelectric capacitors, wherein:

each of the conductive patterns are electrically connected to at least two adjacent rows of four adjacent ferroelectric capacitors;

the conductive patterns are arranged along even numbered and odd numbered rows; and the plate lines extend along even numbered and odd numbered columns, and each of the plate lines in the even numbered columns is electrically connected to at least two conductive patterns in the even numbered rows and is electrically isolated from the conductive patterns in the odd numbered rows, and each of the plate lines in the odd numbered columns is electrically connected to at least two conductive patterns in the odd numbered rows and is electrically isolated from the conductive patterns in the even numbered rows.

4. A ferroelectric memory device comprising:

a semiconductor substrate;

a plurality of ferroelectric capacitors, each comprising a bottom electrode, a ferroelectric layer, and an upper electrode layer, wherein the ferroelectric capacitors are arranged in rows and columns on the semiconductor substrate;

a plurality of columns of plate lines, wherein each of the plate lines is electrically connected to a plurality of the ferroelectric capacitors in a row; and a plurality of conductive patterns, each on, and electrically connected to, at least four adjacent ferroelectric capacitors in a row, wherein the plate lines are on, and electrically connected to, the conductive patterns opposite to the ferroelectric capacitors, wherein:

the plate lines and the conductive patterns are arranged in columns and rows;

each of the conductive patterns is on, and electrically connected to, $2^{k+1}*2$ of the upper electrodes of $2^{k+1}*2$ of the ferroelectric capacitors, and is orthogonal to $2^k$ of the plate lines, wherein k is natural number; and the plate lines in the $2^{k}*(n-1)+i$ columns are electrically connected to the conductive patterns in the $2^{k}*(n-1)+i$ rows, wherein n is a natural number and i is in a range from 1 to $2^k$.

5. A ferroelectric memory device comprising:

a semiconductor substrate;

a plurality of ferroelectric capacitors, each comprising a bottom electrode, a ferroelectric layer, and an upper electrode layer, wherein the ferroelectric capacitors are arranged in rows and columns on the semiconductor substrate; and a plurality of columns of plate lines, wherein each of the plate lines is electrically connected to a plurality of the ferroelectric capacitors in a row, wherein:

groups of eight adjacent ferroelectric capacitors have upper electrodes that are electrically connected as a common upper electrode;

the common upper electrodes are arranged in odd and even numbered columns and rows;

the plate lines extend along even numbered and odd numbered columns;

two adjacent plate lines are on each of the common upper electrodes;

each of the plate lines in the odd numbered columns are electrically connected to at least two of the common upper electrodes in the odd numbered columns and are electrically isolated from the common upper electrodes in the even numbered columns; and each of the plate lines in the even numbered columns are electrically connected to at least two of the common upper electrodes in the even numbered columns and are electrically isolated from the common upper electrodes in the odd numbered columns.

6. A ferroelectric memory device comprising:

a semiconductor substrate;

a plurality of ferroelectric capacitors, each comprising a bottom electrode, a ferroelectric layer, and an upper electrode layer, wherein the ferroelectric capacitors are arranged in rows and columns on the semiconductor substrate; and a plurality of columns of plate lines, wherein each of the plate lines is electrically connected to a plurality of the ferroelectric capacitors in a row, wherein:

the upper electrodes of $2^{k+1}*2$ of the ferroelectric capacitors arranged in two rows of $2^{k+1}$ columns are commonly connected as a common upper electrode;

$2^k$ of the plate lines are on each of the common upper electrodes and extend along columns; and each of the plate lines in the $2^{k}*(n-1)+i$ columns is electrically connected to the common upper electrode in the $2^{k}*(n-1)+i$ rows, wherein n is a natural number and i is in a range from 1 to $2^k$.

7. A ferroelectric memory device comprising:

a semiconductor substrate;

a plurality of ferroelectric capacitors, each comprising a bottom electrode, a ferroelectric layer, and an upper electrode layer, wherein the ferroelectric capacitors are arranged in rows and columns on the semiconductor substrate;

a plurality of columns of plate lines, wherein each of the plate lines is electrically connected to a plurality of the ferroelectric capacitors in a row; and a plurality of conductive patterns, each on, and electrically connected to, at least four of the ferroelectric capacitors, wherein the plate lines are on, and electrically connected to, the conductive patterns opposite to the ferroelectric capacitors, and wherein at least four of the plate lines are on are on each of the conductive patterns.

8. The ferroelectric memory device of claim 7, wherein:
each of the conductive patterns are on, and electrically connected to, 2k+1 of the ferroelectric capacitors in a row; and
$2^{k+1}$ of the plate lines are on each of the conductive patterns, and
the plate lines in the $2^{k+1}*(n-1)+i$ columns are electrically connected to the conductive patterns in the $2^{k+1}*(n-1)+i$ rows, wherein n is a natural number and i is in a range from 1 to $2^{k+1}$.

9. The ferroelectric memory device of claim 8, wherein the conductive patterns are directly connected to the upper electrodes of the ferroelectric capacitors.

10. The ferroelectric memory device of claim 7, further comprising an insulating layer between the conductive patterns and the plate lines, and wherein the conductive patterns are electrically connected to the plate lines through via holes in the insulating layer.

11. A ferroelectric memory device comprising:
a semiconductor substrate;
a plurality of ferroelectric capacitors, each comprising a bottom electrode, a ferroelectric layer, and an upper electrode layer, wherein the ferroelectric capacitors are arranged in rows and columns on the semiconductor substrate; and
a plurality of columns of plate lines, wherein each of the plate lines is electrically connected to a plurality of the ferroelectric capacitors in a row, wherein:
the upper electrodes of at least four of the ferroelectric capacitors in a row are electrically connected to form a common upper electrode; and
at least four of the plate lines are on the common upper electrode.

12. The ferroelectric memory device of claim 11, wherein:
the upper electrodes of $2^{k+1}$ of the ferroelectric capacitors in a row are electrically connected as a common upper electrode;
$2^{k+1}$ of the plate lines are on each of the common upper electrodes; and
the plate lines in the $2^{k+1}*(n-1)+i$ columns are electrically connected to the conductive patterns in the $2^{k+1}*(n-1)+i$ rows, wherein n is a natural number and i is in a range from 1 to $2^{k+1}$.

13. A ferroelectric memory device comprising:
a semiconductor substrate;
a plurality of columns of word lines;
a plurality of rows of bit lines, wherein the bit lines are on the word lines;
a plurality of ferroelectric capacitors in rows and columns on the bit lines; and
a plurality of columns of plate lines, wherein each of the plate lines is on a plurality of the ferroelectric capacitors, and wherein each of the plate lines is electrically connected to $2^{k+1}*2$ of the ferroelectric capacitors, wherein k is natural number, groups of $2^{k+1}*2$ of the ferroelectric capacitors have a common upper electrode, and $2^k$ of the plate lines are on, and electrically connected to, the common upper electrodes of each of the groups of the ferroelectric capacitors.

14. The ferroelectric memory device of claim 13, wherein the plate lines in the $2^k*(n-1)+i$ columns are electrically connected to the conductive patterns in the $2^k*(n-1)+i$ rows, and wherein n is natural number and i is in a range from 1 to $2^k$.

15. A ferroelectric memory device comprising:
a semiconductor substrate;
a plurality of columns of word lines;
a plurality of rows of bit lines, wherein the bit lines are on the word lines;
a plurality of ferroelectric capacitors in rows and columns on the bit lines; and
a plurality of columns of plate lines, wherein each of the plate lines is on a plurality of the ferroelectric capacitors, and wherein each of the plate lines is electrically connected to $2^{k+1}*2$ of the ferroelectric capacitors, wherein k is natural number, further comprising a plurality of conductive patterns in rows and columns, wherein the conductive patterns are between, and electrically connected to, the ferroelectric capacitors and the plate lines, and wherein each of the conductive patterns is under $2^k$ of the plate lines and is electrically connected to $2^{k+1}*2$ of the ferroelectric capacitors.

16. The ferroelectric memory device of claim 15, wherein the plate lines in the $2^k*(n-1)+i$ columns are electrically connected to the conductive patterns in the $2^k*(n-1)+i$ rows, and n is a natural number and i is in a range from 1 to $2^k$.

17. The ferroelectric memory device of claim 16, wherein each of the ferroelectric capacitors comprise a bottom electrode, a ferroelectric layer, and an upper electrode layer, and wherein the conductive patterns are directly connected to the upper electrodes of the ferroelectric capacitors.

18. The ferroelectric memory device of claim 16, further comprising an insulating layer between the conductive patterns and the plate lines, and wherein the conductive patterns are electrically connected to the plate lines through via holes in the insulating layer.

19. A ferroelectric memory device comprising:
a semiconductor substrate;
a plurality of columns of word lines on the substrate;
a plurality of rows of bit lines, wherein the bit lines are on the word lines;
a plurality of ferroelectric capacitors in rows and columns on the bit lines; and
a plurality of columns of plate lines, wherein each of the plate lines is electrically connected to $2^{k+1}$ of the ferroelectric capacitors along a row, wherein k is natural number, a plurality of conductive patterns, each one between, and electrically connecting, the ferroelectric capacitors and the plate lines, wherein each of the conductive patterns is under $2^{k+1}$ of the plate lines and is electrically connected to $2^{k+1}$ of the ferroelectric capacitors.

20. The ferroelectric memory device of claim 19, wherein the plate lines in the $2^{k+1}*(n-1)+i$ columns are electrically connected to the conductive patterns in the $2^{k+1}*(n-1)+i$ rows, wherein n is natural number and i is in a range from 1 to $2^{k+1}$.

21. The ferroelectric memory device of claim 20, wherein each of the ferroelectric capacitors comprise a bottom electrode, a ferroelectric layer, and an upper electrode layer, and wherein the conductive patterns are directly connected to the upper electrodes of the ferroelectric capacitors.

22. The ferroelectric memory device of claim 20, further comprising an insulating layer between the conductive patterns and the plate lines, and wherein the conductive patterns are electrically connected to the plate lines through via holes in the insulating layer.

23. A ferroelectric memory device comprising:
a semiconductor substrate;
a plurality of columns of word lines on the substrate;
a plurality of rows of bit lines, wherein the bit lines are on the word lines;
a plurality of ferroelectric capacitors in rows and columns on the bit lines; and
a plurality of columns of plate lines, wherein each of the plate lines is electrically connected to $2^{k+1}$ of the ferroelectric capacitors along a row, wherein k is natural number, wherein:

groups of $2^{k+1}$ of the ferroelectric capacitors are electrically connected to a common upper electrode, each of the plate lines are electrically connected to the common upper electrode of one of the groups of the ferroelectric capacitors, the plate lines in the $2^{k+1}*(n-1)+i$ columns are electrically connected to the common upper electrode in the $2^{k+1}*(n-1)+i$ rows, and wherein n is a natural number and i is in a range from 1 to $2^{k+1}$.

* * * * *